(12) United States Patent
Cho et al.

(10) Patent No.: US 12,471,401 B2
(45) Date of Patent: Nov. 11, 2025

(54) IMAGE SENSOR PACKAGE

(71) Applicant: Samsung Electronics Co., Ltd., Suwon-si (KR)

(72) Inventors: Kyongsoon Cho, Incheon (KR); Ikjun Choi, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 404 days.

(21) Appl. No.: 18/063,268

(22) Filed: Dec. 8, 2022

(65) Prior Publication Data

US 2023/0268370 A1 Aug. 24, 2023

(30) Foreign Application Priority Data

Feb. 21, 2022 (KR) .................. 10-2022-0022457

(51) Int. Cl.
*H10F 39/00* (2025.01)

(52) U.S. Cl.
CPC ......... *H10F 39/811* (2025.01); *H10F 39/809* (2025.01); *H01L 2224/0812* (2013.01); *H01L 2224/08123* (2013.01); *H01L 2224/08135* (2013.01); *H01L 2224/08145* (2013.01); *H01L 2224/08146* (2013.01); *H01L 2224/08147* (2013.01)

(58) Field of Classification Search
CPC .............. H10F 39/809; H10F 39/811; H01L 2224/0812; H01L 2224/08135; H01L 2224/08123; H01L 2224/08145; H01L 2224/08146; H01L 2224/08147
See application file for complete search history.

(56) References Cited

U.S. PATENT DOCUMENTS

| 6,876,565 B2 | 4/2005 | Meguro et al. |
| 7,504,587 B2 | 3/2009 | Masu et al. |
| 8,304,913 B2 | 11/2012 | Nalla et al. |
| 8,338,939 B2 | 12/2012 | Lin et al. |

(Continued)

FOREIGN PATENT DOCUMENTS

| KR | 10-2019-0078034 A | 7/2019 |
| KR | 10-2020-0118667 A | 10/2020 |

OTHER PUBLICATIONS

Office Action in Korean Appln. No. 10-2022-0022457, mailed on Sep. 9, 2025, 19 pages (with English translation).

*Primary Examiner* — David A Zarneke
(74) *Attorney, Agent, or Firm* — Fish & Richardson P.C.

(57) ABSTRACT

An image sensor package includes a first substrate portion including a first substrate and an upper wiring structure, the upper wiring structure including a stacked structure including a plurality of upper wiring patterns and a plurality of upper wiring vias. The image sensor package includes a second substrate portion including a second substrate and a lower wiring structure, the second substrate defining a trench portion and a via hole. The lower wiring structure includes a stacked structure including a plurality of lower wiring patterns and a plurality of lower wiring vias. The lower wiring structure is in contact with the upper wiring structure, and the plurality of lower wiring patterns include a plurality of lower patterns at different vertical levels. The image sensor package includes a via electrode portion covering an inner sidewall and a bottom surface of the via hole.

20 Claims, 27 Drawing Sheets

(56) References Cited

U.S. PATENT DOCUMENTS

| | | | |
|---|---|---|---|
| 8,421,245 B2 | 4/2013 | Gonzalez et al. | |
| 8,519,459 B2* | 8/2013 | Horiike | H10F 39/811 |
| | | | 257/E23.141 |
| 8,541,878 B2* | 9/2013 | Takahashi | H10F 39/8053 |
| | | | 257/E23.152 |
| 8,653,648 B2 | 2/2014 | Chen et al. | |
| 9,082,820 B2* | 7/2015 | Shimotsusa | H01L 21/768 |
| 9,177,914 B2 | 11/2015 | Tseng et al. | |
| 9,472,472 B2* | 10/2016 | Matsugai | H01L 25/0657 |
| 9,536,777 B2* | 1/2017 | Lin | H01L 24/09 |
| 9,536,928 B2* | 1/2017 | Moon | H10K 59/131 |
| 9,613,994 B2* | 4/2017 | Yamashita | H10F 39/803 |
| 9,764,153 B2* | 9/2017 | Tsai | A61N 1/3987 |
| 9,773,831 B1 | 9/2017 | Yang et al. | |
| 9,997,424 B2 | 6/2018 | Arvin et al. | |
| 10,186,480 B2 | 1/2019 | Muthukumar et al. | |
| 10,325,834 B2 | 6/2019 | Meinhold et al. | |
| 10,629,643 B2* | 4/2020 | Kim | H01L 21/76898 |
| 10,658,413 B2* | 5/2020 | Park | H01L 23/5226 |
| 11,289,525 B2* | 3/2022 | Yamagishi | H04N 25/677 |
| 11,430,824 B2* | 8/2022 | Kim | H10F 39/8063 |
| 11,664,364 B2* | 5/2023 | Chiu | H01L 25/18 |
| | | | 257/621 |
| 2018/0315789 A1* | 11/2018 | Takahashi | H10F 39/8067 |
| 2019/0165027 A1* | 5/2019 | Ishino | H10F 39/809 |
| 2019/0341409 A1* | 11/2019 | Yamabi | H04N 23/55 |
| 2020/0306552 A1 | 10/2020 | Tsai et al. | |
| 2022/0085085 A1* | 3/2022 | Song | H10F 39/812 |
| 2022/0181376 A1* | 6/2022 | Lee | H10F 39/809 |
| 2024/0145514 A1* | 5/2024 | Hur | H10F 39/807 |

* cited by examiner

IMAGE SENSOR PACKAGE

CROSS-REFERENCE TO RELATED APPLICATION

This application claims priority under 35 U.S.C. § 119 to Korean Patent Application No. 10-2022-0022457, filed on Feb. 21, 2022, in the Korean Intellectual Property Office, the disclosure of which is incorporated by reference herein in its entirety.

FIELD

The inventive concepts relate to an image sensor package, and more particularly, to an image sensor package including a back via stack.

BACKGROUND

An image sensor that captures an image and converts the image into an electric signal may be used not only in consumer electronic devices, such as digital cameras, mobile phone cameras, and portable camcorders, but also in cameras mounted on automobiles, security devices, and robots. Therefore, an image sensor package, in which an image sensor is implemented as a package, has been developed and utilized as a core component.

SUMMARY

The inventive concepts provide an image sensor package, which may ensure electrical connection reliability. According to some example embodiments of the inventive concepts, an image sensor package includes a first substrate portion comprising a first substrate and an upper wiring structure, the first substrate including a first surface and a second surface opposite to the first surface, the first substrate comprising a sensor portion, a plurality of active pixels in the sensor portion, the upper wiring structure on the first surface of the first substrate, and the upper wiring structure comprising a stacked structure including a plurality of upper wiring patterns and a plurality of upper wiring vias. The image sensor package includes a second substrate portion comprising a second substrate and a lower wiring structure, the second substrate including a third surface and a fourth surface opposite to the third surface, the second substrate defining a trench portion extending inward from the fourth surface of the second substrate, the second substrate defining a via hole extending from a bottom surface of the trench portion to the third surface of the second substrate, the lower wiring structure on the third surface of the second substrate, and the lower wiring structure comprising a stacked structure including a plurality of lower wiring patterns and a plurality of lower wiring vias, wherein the lower wiring structure is in contact with the upper wiring structure, the plurality of lower wiring patterns comprise a plurality of lower patterns at different vertical levels. The image sensor package includes a via electrode portion covering an inner sidewall and a bottom surface of the via hole, the via electrode portion extending into the lower wiring structure and connected to at least a portion of the plurality of lower wiring patterns, and, in the lower wiring structure, the via electrode portion entirely overlaps at least two of the plurality of lower patterns in a vertical direction, the at least two of the plurality of lower patterns at different vertical levels.

According to some example embodiments of the inventive concepts, an image sensor package includes a first substrate portion comprising a first substrate including a first surface and a second surface opposite to the first surface, the first substrate portion including and an upper wiring structure on the first surface of the first substrate, and a second substrate portion including a second substrate and a lower wiring structure, the second substrate including a third surface and a fourth surface opposite to the third surface, the lower wiring structure on the third surface of the second substrate, and the lower wiring structure comprising a stacked structure including a plurality of lower wiring patterns and a plurality of lower wiring vias, wherein the lower wiring structure is in contact with the upper wiring structure. The image sensor package includes a via electrode portion passing through the second substrate and connected to at least a portion of the plurality of lower wiring patterns. In the lower wiring structure, the via electrode portion entirely overlaps at least two of the plurality of lower wiring patterns vertically, the at least two of the plurality of lower wiring patterns are at at least two different vertical levels, and the via electrode portion is in contact with and electrically connected to the at least two of the plurality of lower wiring patterns located at the at least two different vertical levels.

According to some example embodiments of the inventive concepts, an image sensor package includes a first substrate including a first surface and a second surface opposite to the first surface, the first substrate comprising a sensor portion, and a plurality of active pixels in the sensor portion. The package includes a glass plate on the second surface of the first substrate, a dam structure between the glass plate and the first substrate, the dam structure including an outer side surface aligned with a side surface of the glass plate in a vertical direction, an upper wiring structure on the first surface of the first substrate, the upper wiring structure comprising a stacked structure including a plurality of upper wiring patterns and a plurality of upper wiring vias, and a second substrate including a third surface and a fourth surface opposite to the third surface, the second substrate defining a trench portion extending inward from the fourth surface thereof, and the second substrate defining a via hole extending from a bottom surface of the trench portion to the third surface of the second substrate. The package includes a lower wiring structure on the third surface of the second substrate, the lower wiring structure in contact with the upper wiring structure, the lower wiring structure comprising a stacked structure including a plurality of lower wiring patterns and a plurality of lower wiring vias, the plurality of lower wiring patterns comprising a plurality of lower patterns located at different vertical levels. The package includes a first passivation layer covering an inner sidewall of the trench portion, an inner sidewall of the via hole, and the fourth surface of the second substrate. The package includes a lower electrode layer comprising a via electrode portion and a back wiring portion, wherein the via electrode portion is on the first passivation layer, the via electrode portion covers an inner sidewall and a bottom surface of the via hole, the via electrode portion is connected to at least a portion of the plurality of lower wiring patterns by extending into the lower wiring structure, the back wiring portion is electrically connected to the via electrode portion, the back wiring portion is on a portion of the first passivation layer, and the portion of the first passivation layer covers the fourth surface of the second substrate. The package includes a second passivation layer covering a portion of the lower electrode layer, and a plurality of external connection terminals on the fourth surface of the second substrate, the plurality of external connection terminals electrically connected to the back wiring portion. In the lower wiring structure, the via electrode portion entirely overlaps at least two of the plurality of lower patterns in the vertical direction, the at least two of the plurality of lower patterns are at at least two different vertical levels, and the via electrode portion is in contact with and electrically connected to the at least two of the plurality of lower patterns located at the at least two different vertical levels.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF SOME EXAMPLE EMBODIMENTS

Figure 1A:
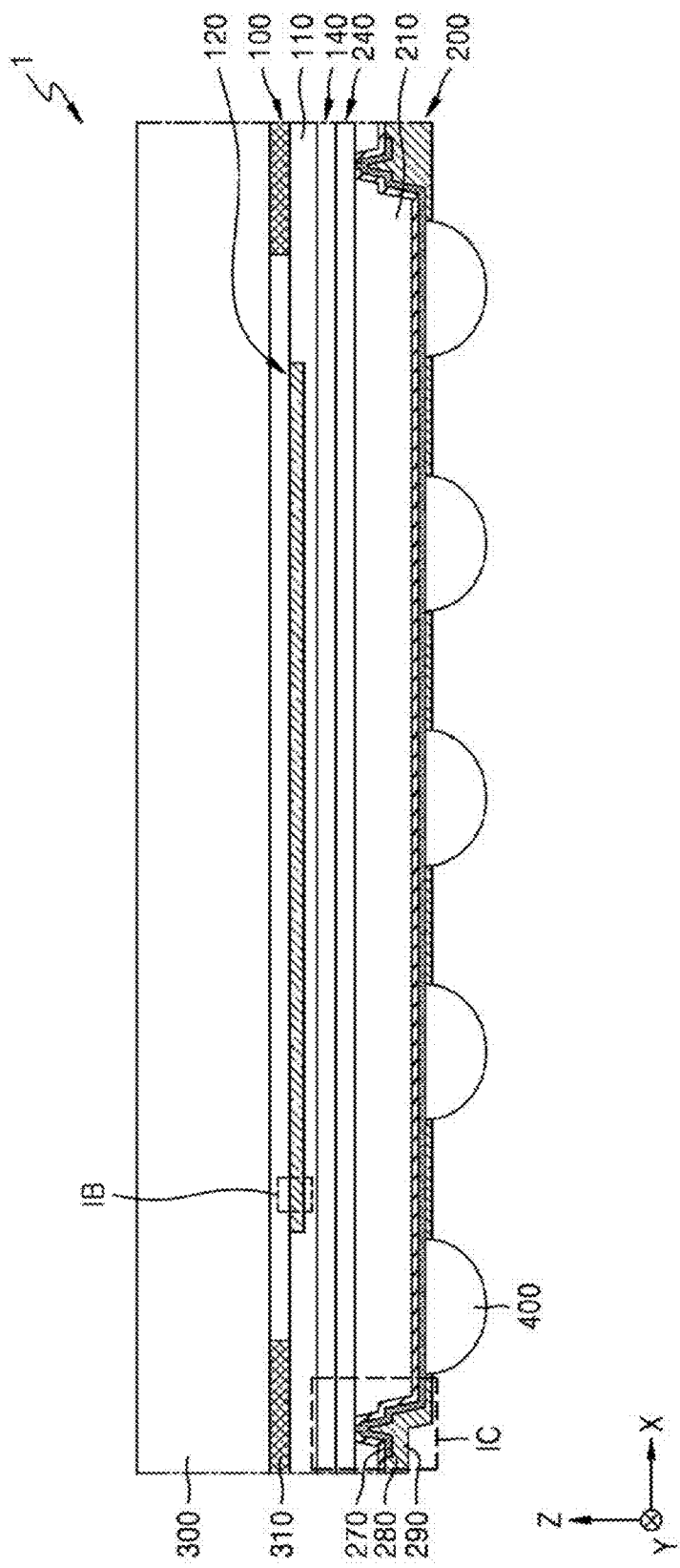
FIG. 1A is a cross-sectional view of an image sensor package according to some example embodiments.
Figure 1B:
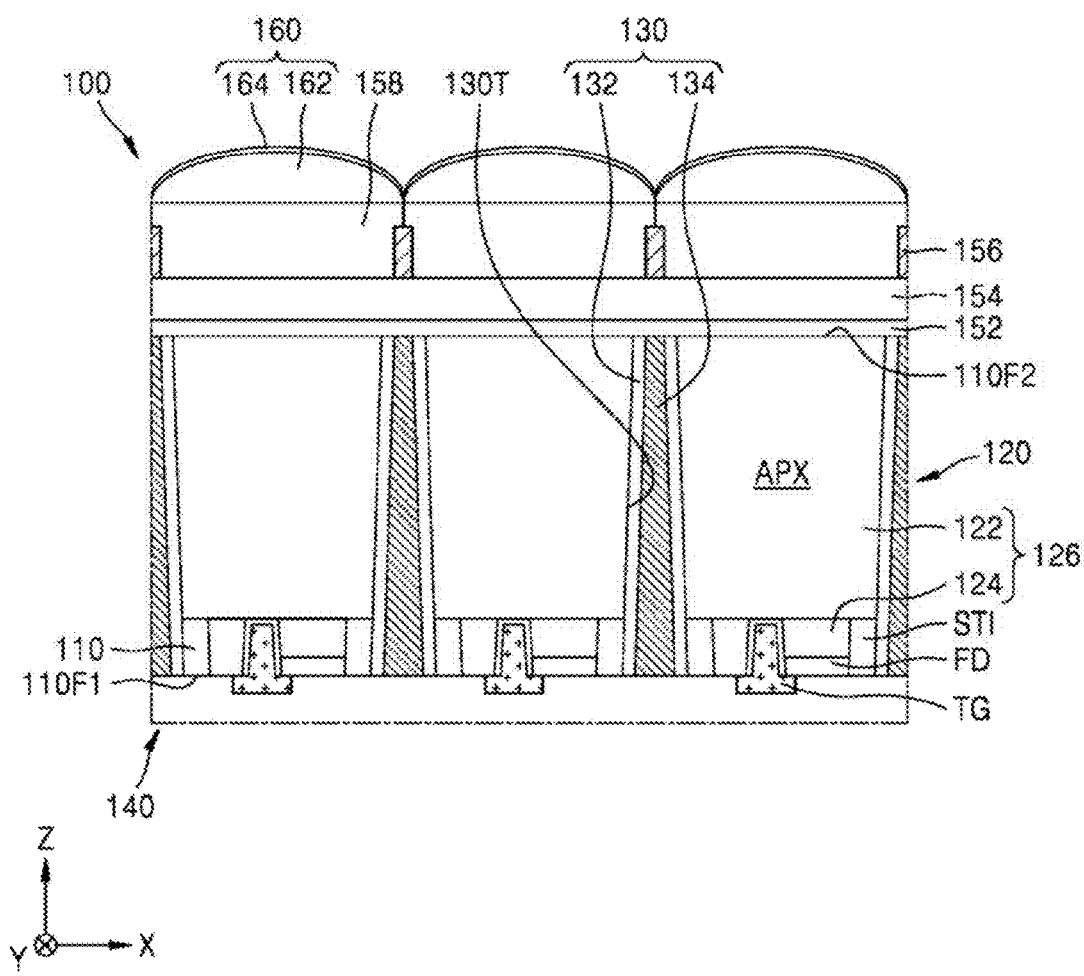
FIGS. 1B and 1C are cross-sectional views of a portion of the image sensor package shown in FIG. 1A.
Figure 1C:
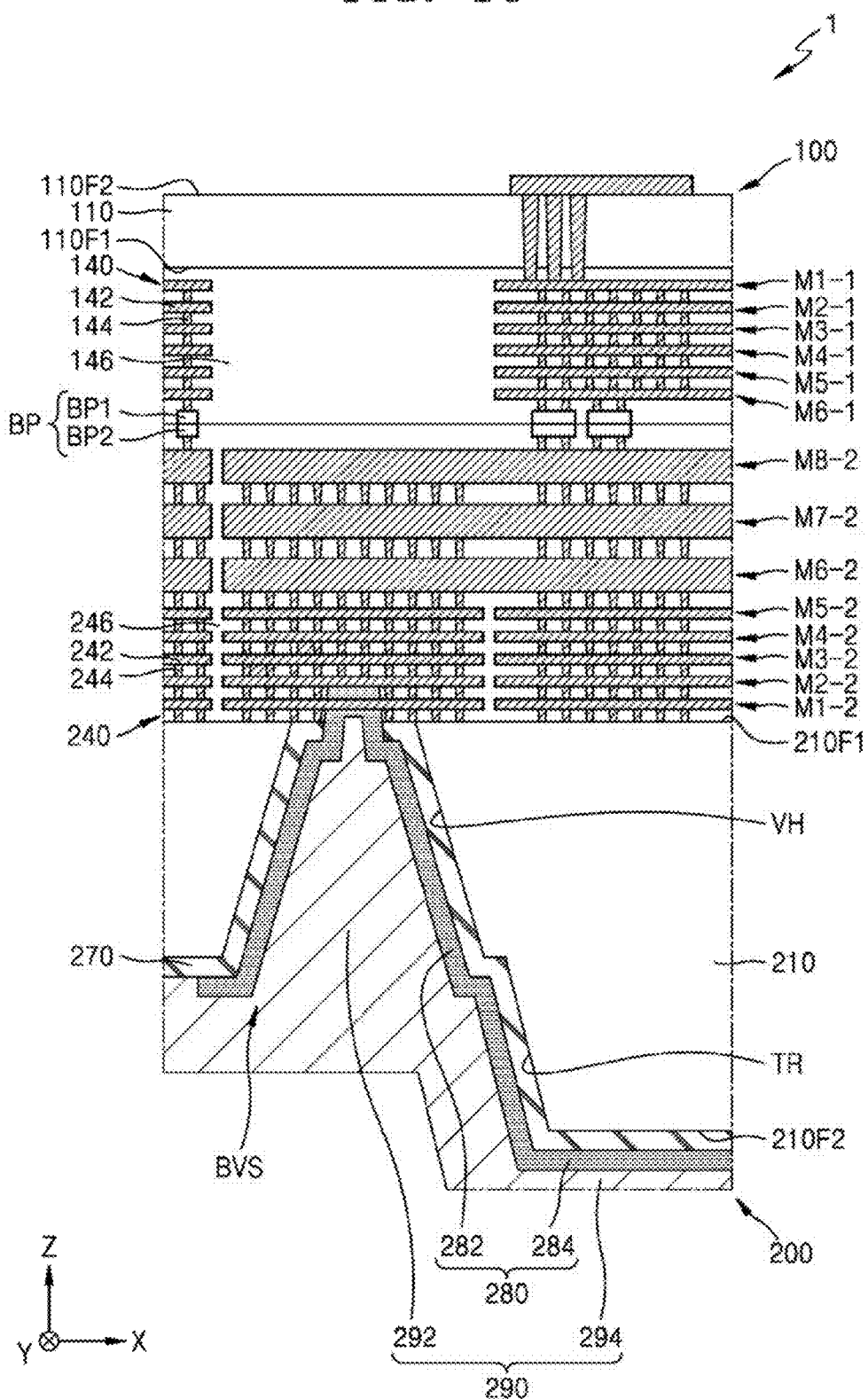

FIG. 1A is a cross-sectional view of an image sensor package 1 according to some example embodiments, and FIGS. 1B and 1C are cross-sectional views of a portion of the image sensor package 1 shown in FIG. 1A. Specifically, FIG. 1B is an enlarged cross-sectional view of portion IB of FIG. 1A, and FIG. 1C is an enlarged cross-sectional view of portion IC of FIG. 1A.

Referring to FIG. 1A, the image sensor package 1 may include a first substrate portion 100, a second substrate portion 200, a dam structure 310, and a glass plate 300. In the image sensor package 1, the first substrate portion 100 may be stacked on the second substrate portion 200 in a vertical direction (e.g., Z direction), the dam structure 310 may be adhered onto the first substrate portion 100, and the glass plate 300 may be stacked on the dam structure 310 in the vertical direction (Z direction).

The first substrate portion 100 may include a first substrate 110, a sensor portion 120, and an upper wiring structure 140.

The first substrate 110 may include a semiconductor substrate. For instance, the first substrate 110 may include a Group IV semiconductor material, a Group III-V semiconductor material, or a Group II-VI semiconductor material. The Group IV semiconductor material may include, for example, silicon (Si), germanium (Ge), or silicon germanium (SiGe). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS), but example embodiments are not limited to the above materials.

In some example embodiments, the first substrate 110 may include a P-type silicon substrate. In some other example embodiments, the first substrate 110 may include a P-type bulk substrate and a P-type or N-type epi-layer grown on the P-type bulk substrate. In still other example embodiments, the first substrate 110 may include an N-type bulk substrate and a P-type or N-type epi-layer grown on the N-type bulk substrate. In yet other example embodiments, the first substrate 110 may include an organic plastic substrate.

The sensor portion 120 may include, for example, a complementary-metal-oxide-semiconductor (CMOS) image sensor (CIS) or a charge-coupled device (CCD). In some example embodiments, a plurality of active pixels (e.g., refer to APX in FIG. 1B) may be arranged in a matrix form in the sensor portion 120.

The upper wiring structure 140 will be described in detail with reference to FIG. 1C.

The second substrate portion 200 may include a second substrate 210 and a lower wiring structure 240. The second substrate portion 200 may be stacked on the first substrate portion 100 such that the lower wiring structure 240 is in contact with the upper wiring structure 140. The second substrate 210 may include a semiconductor substrate. In some example embodiments, the second substrate 210 may include the same material as or a similar material to that of the first substrate 110. The lower wiring structure 240 will be described in detail with reference to FIG. 1C.

The second substrate portion 200 may include a lower electrode layer 280, which passes through the second substrate 210 and is connected to the lower wiring structure 240, a first passivation layer 270 between the lower electrode layer 280 and the second substrate 210, and a second passivation layer 290 covering the lower electrode layer 280. The lower electrode layer 280 may be between the first passivation layer 270 and the second passivation layer 290. The lower electrode layer 280 may pass through the first passivation layer 270 and be connected to the lower wiring structure 240.

The first passivation layer 270 may include, for example, oxide, nitride, oxynitride, or a combination thereof. In some example embodiments, the first passivation layer 270 may include a stacked structure of hafnium oxide, silicon nitride, and hafnium oxide. For instance, the first passivation layer 270 may have a thickness in a range of about 100 mm to about 300 mm.

The lower electrode layer 280 may include, for example, a metal material, such as titanium, titanium nitride, tantalum, tantalum nitride, titanium tungsten, tungsten, aluminum, cobalt, nickel, and copper, or an alloy material thereof, but example embodiments are not limited thereto. In some example embodiments, the lower electrode layer 280 may be formed by using a chemical vapor deposition (CVD) process or an atomic layer deposition (ALD) process. For example, the lower electrode layer 280 may have a thickness in a range of about 2 μm to about 4 μm.

The second passivation layer 290 may include, for example, an insulating material, such as silicon oxide and silicon nitride. In some example embodiments, the second passivation layer 290 may include tetraethyl orthosilicate (TEOS) or plasma enhanced-TEOS (PE-TEOS).

A plurality of external connection terminals 400 may be adhered to a lower surface of the second substrate portion 200. For example, the plurality of external connection terminals 400 may be on a fourth surface (e.g., refer to 210F2 in FIG. 1C) of the second substrate 210. The second passivation layer 290 may expose portions of the lower electrode layer 280 by not covering the portions of the lower electrode layer 280, and the plurality of external connection terminals 400 may be respectively connected to the portions of the lower electrode layer 280, which are not covered by the second passivation layer 290. Each of the plurality of external connection terminals 400 may be electrically connected to the lower wiring structure 240 through the lower electrode layer 280. The connection of the lower electrode layer 280 with the lower wiring structure 240 will be described in detail with reference to FIGS. 1C, 2A, 2B, 2C, and 2D.

The glass plate 300 may be on the first substrate portion 100. For example, the glass plate 300 may be on a second surface (e.g., refer to 110F2 in FIGS. 1B and 1C) of the first substrate 110. The dam structure 310 may be between the glass plate 300 and the first substrate 110. The glass plate 300 may be a desired (or, alternatively predetermined) distance apart from the first substrate portion 100 in the vertical direction (Z direction). For example, the glass plate 300 may be apart from the sensor portion 120 in the vertical direction (Z direction). The glass plate 300 may include a transparent material capable of introducing light for forming an image into the sensor portion 120.

In some example embodiments, the glass plate 300 may include an infrared (IR) cut-off filter (IRCF) and/or a blue glass (or a blue filter) for an IR filter. In some other example embodiments, the glass plate 300 may be replaced by a film filter. However, a material of the glass plate 300 is not limited thereto and may include a material allowing light for forming an image to be incident on the sensor portion 120.

A lateral area of the glass plate 300 may be greater than a lateral area of the sensor portion 120. In some example embodiments, the lateral area of the glass plate 300 may be substantially equal to a lateral area of the first substrate portion 100. In some example embodiments, the lateral area of the first substrate portion 100 may be substantially equal to a lateral area of the second substrate portion 200. For example, the first substrate portion 100, the second substrate portion 200, and the glass plate 300 may have substantially the same lateral area as each other and entirely overlap each other in the vertical direction (Z direction).

In some example embodiments, the lateral area of the glass plate 300 may be substantially equal to a lateral area of an inner space defined by an outer side surface of the dam structure 310. For example, a side surface of the first substrate portion 100, a side surface of the second substrate portion 200, a side surface of the glass plate 300, and the outer side surface of the dam structure 310 may be aligned with each other in the vertical direction (Z direction). A lower surface of the glass plate 300 may be substantially coplanar with an upper surface of the dam structure 310. Accordingly, the glass plate 300 may be connected to the first substrate portion 100 through the dam structure 310.

Referring to FIGS. 1A and 1B together, the first substrate portion 100 of the image sensor package 1 may include the first substrate 110, the sensor portion 120, and the upper wiring structure 140. The first substrate 110 may have a first surface 110F1 and a second surface 110F2, which are opposite to each other. As used herein, for brevity, a surface of the first substrate 110, on which a color filter layer 158 is located, may be referred to as the second surface 110F2, and a surface opposite to the second surface 110F2 may be referred to as the first surface 110F1. However, the inventive concepts are not limited thereto.

The sensor portion 120 may include a plurality of active pixels APX, which are arranged in a matrix form in the first substrate 110. A plurality of photoelectric conversion regions 126, each of which includes a photodiode region 122 and a well region 124, may be respectively arranged in the plurality of active pixels APX. A pixel element isolation film 130 may be in the first substrate 110, and the plurality of active pixels APX may be defined by the pixel element isolation film 130. The pixel element isolation film 130 may be between one of the plurality of photoelectric conversion regions 126 and the photoelectric conversion region 126 adjacent thereto. One photoelectric conversion region 126 may be physically and electrically separated from another photoelectric conversion region 126 adjacent thereto by the pixel element isolation film 130. The pixel element isolation film 130 may be between the plurality of photoelectric conversion regions 126 arranged in a matrix form, and have a grid or mesh shape in a view from above.

The pixel element isolation film 130 may be formed inside a pixel trench 130T, which passes through the first substrate 110 from the first surface 110F1 of the first substrate 110 to the second surface 110F2 thereof. The pixel element isolation film 130 may include an insulating liner 132 and a buried conductive layer 134. The insulating liner 132 may be conformally formed on a sidewall of the pixel trench 130T. The buried conductive layer 134 may fill the inside of the pixel trench 130T and be on the insulating liner 132. In some example embodiments, the insulating liner 132 may include a metal oxide, such as hafnium oxide, aluminum oxide, and tantalum oxide. In some other example embodiments, the insulating liner 132 may include an insulating material, such as silicon oxide, silicon nitride, and silicon oxynitride. The buried conductive layer 134 may include, for example, at least one of doped polysilicon, metal, metal silicide, metal nitride, and a metal-containing film, but example embodiments are not limited thereto.

In some example embodiments, the pixel element isolation film 130 may have a tapered shape of which a lateral width reduces in a first lateral direction (X direction) from the same or substantially the same vertical level as the first surface 110F1 of the first substrate 110 to the same or substantially the same vertical level as the second surface 110F2 thereof.

A device isolation film STI may be formed from the first surface 110F1 of the first substrate 110 toward second surface 110F2 thereof to define an active region (not shown) and a floating diffusion region FD. In some example embodiments, gate electrodes constituting a plurality of transistors may be formed at the first surface 110F1 of the first substrate 110. For example, the plurality of transistors may include a transfer transistor configured to transmit charges generated by the photoelectric conversion region 126 to the floating diffusion region FD, a reset transistor configured to periodically reset charges stored in the floating diffusion region FD, a drive transistor serving as a source follower buffer amplifier and configured to buffer a signal according to the charges stored in the floating diffusion region FD, and a selection transistor configured to perform switching and address operations for selecting the active pixel APX. However, the plurality of transistors are not limited thereto.

FIG. 1B illustrates a transfer gate TG forming the transfer transistor, from among the gate electrodes constituting the plurality of transistors. Although the transfer gate TG forming the transfer transistor is illustrated as an example as a recess gate type extending into the first substrate 110 from the first surface 110F1 of the first substrate 110, a shape of the transfer gate TG is not limited thereto.

In some other example embodiments, a reset gate, a source follower gate, and a selection gate, which respectively form the reset transistor, the drive transistor, and the selection transistor, from among the plurality of transistors, may be formed on the second substrate 210 and be in the second substrate portion 200.

The upper wiring structure 140 may be on the first surface 110F1 of the first substrate 110. The upper wiring structure 140 may be electrically connected to the gate electrodes or the active region of the first substrate 110. For example, the upper wiring structure 140 may include a conductive material, such as tungsten, aluminum, copper, tungsten silicide, titanium silicide, tungsten nitride, titanium nitride, and doped polysilicon, and an insulating material, such as silicon oxide, silicon nitride, and silicon oxynitride, but example embodiments are not limited thereto.

A cover insulating film 152 may be on the second surface 110F2 of the first substrate 110. In some example embodiments, the cover insulating film 152 may entirely cover a portion of the second surface 110F2 of the first substrate 110, which corresponds to the sensor portion 120. The cover insulating film 152 may be in contact with an upper surface of the pixel element isolation film 130, which is at the same vertical level as the second surface 110F2 of the first substrate 110. In some example embodiments, the cover insulating film 152 may include a metal oxide, such as aluminum oxide and tantalum oxide.

A front passivation layer 154 may cover the cover insulating film 152 on the second surface 110F2 of the first substrate 110. The front passivation layer 154 may include, for example, oxide, nitride, oxynitride, or a combination thereof. In some example embodiments, the front passivation layer 154 may have a stacked structure of hafnium oxide, silicon nitride, and hafnium oxide.

A guide pattern 156 may be formed on the front passivation layer 154. In a view from above, the guide pattern 156 may have a grid or mesh shape. The guide pattern 156 may inhibit or prevent light, which is incident on one photoelectric conversion region 126 at an oblique angle, from entering the photoelectric conversion region 126 adjacent thereto. The guide pattern 156 may include, for example, at least one metal material of tungsten, aluminum, titanium, ruthenium, cobalt, nickel, copper, gold, silver, and platinum, but example embodiments are not limited thereto.

The color filter layer 158 and a microlens 160 may be formed on the front passivation layer 154, on which the guide pattern 156 is formed. The color filter layer 158 may overlap the photoelectric conversion region 126, and the microlens 160 may be on the color filter layer 158. The color filter layer 158 may transmit light, which is incident through the microlens 160, and allow only light having a required wavelength to be incident on the photoelectric conversion region 126.

The color filter layer 158 may include, for example, a red (R) filter, a blue (B) filter, and a green (G) filter. Alternatively, the color filter layer 158 may include a cyan (C) filter, a yellow (Y) filter, and a magenta (M) filter. The color filter layer 158 corresponding to one of the R filter, the B filter, and the G filter and the color filter layer 158 corresponding to one of the C filter, the Y filter, and the M filter may be formed on each of the active pixels APX, and thus, each of the active pixels APX may recognize one color by detecting a separated component of incident light.

The microlens 160 may condense light incident to the image sensor package 1 on the active pixel APX. In some example embodiments, the microlens 160 may include an organic layer 162 and an inorganic layer 164 conformally covering a surface of the organic layer 162. For example, the organic layer 162 may include a thermosetting poly(amic ester) resin (TMR)-based resin (a product of Tokyo Ohka Kogyo, Co.) or a melamine-formaldehyde resin (MFR)-based resin (a product of Japan Synthetic Rubber Corporation).

Referring to FIGS. 1A and 1C, the upper wiring structure 140 may include a stacked structure of a plurality of upper wiring patterns 142 and a plurality of upper wiring vias 144 and an upper interlayer insulating film 146 configured to surround the plurality of upper wiring patterns 142 and the plurality of upper wiring vias 144.

In some example embodiments, the upper wiring structure 140 may be formed by using a damascene process. In some example embodiments, at least one of the plurality of upper wiring patterns 142 may be integrally formed with at least one of the plurality of upper wiring vias 144. In some example embodiments, each of the plurality of upper wiring patterns 142 and the plurality of upper wiring vias 144 may have a tapered shape of which a lateral width reduces from a lower side to an upper side thereof. That is, the plurality of upper wiring patterns 142 and the plurality of upper wiring vias 144 may increase in lateral width in a direction away from the first substrate 110.

The plurality of upper wiring patterns 142 may include a plurality of upper patterns, which are at different vertical levels. For example, the plurality of upper wiring patterns 142 may include a first upper pattern M1-1, a second upper pattern M2-1, a third upper pattern M3-1, a fourth upper pattern M4-1, a fifth upper pattern M5-1, and a sixth upper pattern M6-1, which are at different vertical levels from each other. For example, the first upper pattern M1-1, the second upper pattern M2-1, the third upper pattern M3-1, the fourth upper pattern M4-1, the fifth upper pattern M5-1, and the sixth upper pattern M6-1 may be sequentially arranged in a direction away from the first surface 110F1 of the first substrate 110 in the vertical direction (Z direction).

The plurality of upper wiring vias 144 may be connected to at least one of the first upper pattern M1-1, the second upper pattern M2-1, the third upper pattern M3-1, the fourth upper pattern M4-1, the fifth upper pattern M5-1, and the sixth upper pattern M6-1.

For example, the plurality of upper wiring patterns 142 may have a thickness in a range of about 80 nm to about 1200 nm. In some example embodiments, from among the plurality of upper wiring patterns 142, the sixth upper pattern M6-1 may have a greatest thickness, and the first upper pattern M1-1 may have a smallest thickness, but example embodiments are not limited thereto.

The upper interlayer insulating film 146 on the first surface 110F1 of the first substrate 110 may surround the plurality of upper wiring patterns 142 and the plurality of upper wiring vias 144. The upper interlayer insulating film 146 may include an insulating material, such as silicon oxide, silicon nitride, and silicon oxynitride.

In some example embodiments, the upper wiring structure 140 may include a plurality of first bonding pads BP1. The plurality of first bonding pads BP1 may be electrically connected to the plurality of upper wiring patterns 142 and the plurality of upper wiring vias 144. For example, each of the plurality of first bonding pads BP1 may be connected to at least one of the plurality of upper wiring vias 144. The plurality of first bonding pads BP1 may be on a lower surface of the upper wiring structure 140, which faces the lower wiring structure 240. For example, a lower surface of each of the plurality of first bonding pads BP1 may be coplanar with a lower surface of the upper interlayer insulating film 146, which faces the lower wiring structure 240.

The second substrate portion 200 of the image sensor package 1 may include the second substrate 210 and the lower wiring structure 240. The second substrate 210 may have a third surface 210F1 and the fourth surface 210F2, which are opposite to each other. As used herein, for brevity, a surface of the second substrate 210, on which the lower wiring structure 240 is located, may be referred to as the third surface 210F1, and a surface opposite to the third surface 210F1 may be referred to as the fourth surface 210F2. However, the inventive concepts are not limited thereto. The lower wiring structure 240 may be between the upper wiring structure 140 and the second substrate 210 and be in contact with the upper wiring structure 140.

The lower wiring structure 240 may include a stacked structure of a plurality of lower wiring patterns 242 and a plurality of lower wiring vias 244 and a lower interlayer insulating film 246 configured to surround the plurality of lower wiring patterns 242 and the plurality of lower wiring vias 244.

In some example embodiments, the lower wiring structure 240 may be formed by using a damascene process. In some example embodiments, at least one of the plurality of lower wiring patterns 242 may be integrally formed with at least one of the plurality of lower wiring vias 244. In some example embodiments, each of the plurality of lower wiring patterns 242 and the plurality of lower wiring vias 244 may have a tapered shape of which a lateral width reduces from an upper side to a lower side thereof. That is, each of the plurality of lower wiring patterns 242 and the plurality of lower wiring vias 244 may increase in lateral width in a direction away from the second substrate 210.

The plurality of lower wiring patterns 242 may include a plurality of lower patterns, which are at different vertical levels. For example, the plurality of lower wiring patterns 242 may include a first lower pattern M1-2, a second lower pattern M2-2, a third lower pattern M3-2, a fourth lower pattern M4-2, a fifth lower pattern M5-2, a sixth lower pattern M6-2, a seventh lower pattern M7-2, and an eighth lower pattern M8-2, which are at different vertical levels from each other. For example, the first lower pattern M1-2, the second lower pattern M2-2, the third lower pattern M3-2, the fourth lower pattern M4-2, the fifth lower pattern M5-2, the sixth lower pattern M6-2, the seventh lower pattern M7-2, and the eighth lower pattern M8-2 may be sequentially arranged in a direction away from the third surface 210F1 of the second substrate 210 in the vertical direction (Z direction).

As used herein, the first lower pattern M1-2, the second lower pattern M2-2, the third lower pattern M3-2, the fourth lower pattern M4-2, the fifth lower pattern M5-2, the sixth lower pattern M6-2, the seventh lower pattern M7-2, and the eighth lower pattern M8-2 may be referred to as a first wiring pattern M1-2, a second wiring pattern M2-2, a third wiring pattern M3-2, a fourth wiring pattern M4-2, a fifth wiring pattern M5-2, a sixth wiring pattern M6-2, a seventh wiring pattern M7-2, and an eighth wiring pattern M8-2, respectively.

The plurality of lower wiring vias 244 may be connected to at least one of the first lower pattern M1-2, the second lower pattern M2-2, the third lower pattern M3-2, the fourth lower pattern M4-2, the fifth lower pattern M5-2, the sixth lower pattern M6-2, the seventh lower pattern M7-2, and the eighth lower pattern M8-2.

For example, the plurality of lower wiring patterns 242 may have a thickness in a range of about 80 nm to about 1200 nm. In some embodiments, from among the plurality of lower wiring patterns 242, the eighth lower pattern M8-2 may have a greatest thickness, and the first lower pattern M1-2 may have a smallest thickness, but example embodiments are not limited thereto.

The lower interlayer insulating film 246 244 on the third surface 210F1 of the second substrate 210 may surround the plurality of lower wiring patterns 242 and the plurality of lower wiring vias. The lower interlayer insulating film 246 may include an insulating material, such as silicon oxide, silicon nitride, and silicon oxynitride.

In some example embodiments, the lower wiring structure 240 may include a plurality of second bonding pads BP2. The plurality of second bonding pads BP2 may be electrically connected to the plurality of lower wiring patterns 242 and the plurality of lower wiring vias 244. For example, each of the plurality of second bonding pads BP2 may be connected to at least one of the plurality of lower wiring vias 244. The plurality of second bonding pads BP2 may be on an upper surface of the lower wiring structure 240, which faces the upper wiring structure 140. For example, an upper surface of each of the plurality of second bonding pads BP2 may be coplanar with an upper surface of the lower interlayer insulating film 246, which faces the upper wiring structure 140.

The first bonding pad BP1 and the second bonding pad BP2, which correspond to each other, may form a combination pad BP. A plurality of combination pads BP may be at an interface between the first substrate portion 100 and the second substrate portion 200, that is, at an interface between the upper interlayer insulating film 146 of the upper wiring structure 140 and the lower interlayer insulating film 246 of the lower wiring structure 240. The first bonding pad BP1 and second bonding pad BP2, which correspond to each other to form the combination pad BP, may vertically overlap each other and be adhered to each other. For example, an interface (e.g., a bonding interface) between the first bonding pad BP1 and the second bonding pad BP2 may be coplanar with the interface between the upper interlayer insulating film 146 of the upper wiring structure 140 and the lower interlayer insulating film 246 of the lower wiring structure 240. The first bonding pad BP1 and the second bonding pad BP2, which correspond to each other, may expand by heat and come into contact with each other. Thereafter, metal atoms included in the first bonding pad BP1 and the second bonding pad BP2 may be diffusion bonded to each other and integrally formed with each other to form the combination pad BP. For example, the first substrate portion 100 and the second substrate portion 200 may be stacked by using a metal-oxide hybrid bonding technique.

The second substrate portion 200 may include the lower electrode layer 280, which passes through the second substrate 210 and is connected to the lower wiring structure 240, the first passivation layer 270 between the lower electrode layer 280 and the second substrate 210, and the second passivation layer 290 covering the lower electrode layer 280.

The second substrate 210 may have a trench portion TR and a via hole VH. The trench portion TR may extend into the fourth surface 210F2 of the second substrate 210. The via hole VH may extend from a bottom surface of the trench portion TR to the third surface 210F1 of the second substrate 210. The trench portion TR may communicate with the via hole VH. Although the second substrate 210 is illustrated as having one via hole VH for brevity, the inventive concepts are not limited thereto. For example, the second substrate 210 may have a plurality of via holes VH, which extend from the bottom surface of the trench portion TR to the third surface 210F1 of the second substrate 210. The via hole VH may further extend into the lower wiring structure 240 from the third surface 210F1 of the second substrate 210. For example, the via hole VH may be formed by removing a portion of the second substrate 210 and a portion of the lower interlayer insulating film 246. Some of the plurality of lower wiring patterns 242 may be exposed inside the via hole VH. For example, the first lower pattern M1-2 and the second lower pattern M2-2 may be exposed inside the via hole VH. The first lower pattern M1-2 and the second lower pattern M2-2 may serve as an etch stop film during the formation of the via hole VH.

The first passivation layer 270 may cover an inner sidewall of the trench portion TR, an inner sidewall of the via hole VH, and the fourth surface 210F2 of the second substrate 210. In some example embodiments, the first passivation layer 270 may cover a portion of the bottom surface of the trench portion TR.

The lower electrode layer 280 may cover the first passivation layer 270. The lower electrode layer 280 may pass through the first passivation layer 270 and be connected to the lower wiring structure 240. For example, the lower electrode layer 280 may be connected to some of the plurality of lower wiring patterns 242. For example, the lower electrode layer 280 may be in contact with and electrically connected to the first lower pattern M1-2 and the second lower pattern M2-2.

The lower electrode layer 280 may include a via electrode portion 282 and a back wiring portion 284. The via electrode portion 282 may be electrically connected to the back wiring portion 284. The via electrode portion 282 may be a portion of the lower electrode layer 280, which covers the inner sidewall and a bottom surface of the via hole VH and is connected to some of the plurality of lower wiring patterns 242. For example, the via electrode portion 282 may be in contact with and electrically connected to the first lower pattern M1-2 and the second lower pattern M2-2. The back wiring portion 284 may be a portion of the lower electrode layer 280, which is on a portion of the first passivation layer 270 that covers the fourth surface 210F2 of the second substrate 210. For example, the back wiring portion 284 may be a line pattern. In some example embodiments, the back wiring portion 284 may extend from the portion of the first passivation layer 270, which covers the fourth surface 210F2 of the second substrate 210, to a portion of the first passivation layer 270, which covers a side surface of the trench portion TR, and be connected to the via electrode portion 282. The back wiring portion 284 may be electrically connected to the external connection terminal 400 shown in FIG. 1A.

The second passivation layer 290 may cover a portion of the lower electrode layer 280. The lower electrode layer 280 may be between the first passivation layer 270 and the second passivation layer 290. The second passivation layer 290 may include a buried portion 292 and a back passivation portion 294. The buried portion 292 may be a portion of the second passivation layer 290, which covers the via electrode portion 282 and fills the via hole VH. The back passivation portion 294 may be a portion of the second passivation layer 290, which covers the back wiring portion 284. For example, the back passivation portion 294 may fill at least a portion of the trench portion TR and cover the fourth surface 210F2 of the second substrate 210.

The via electrode portion 282 and the buried portion 292 may be collectively referred to as a via electrode structure BVS. The via electrode structure BVS may be referred to as a back via stack.

Referring to FIGS. 1A to 1C, the image sensor package 1 may include the via electrode structure BVS including the via electrode portion 282 that covers the inner sidewall and the bottom surface of the via hole VH. During the formation of the via hole VH, the first lower pattern M1-2 and the second lower pattern M2-2 may serve as an etch stop film, and the via electrode portion 282 may be connected to the first lower pattern M1-2 and the second lower pattern M2-2.

Accordingly, in the image sensor package 1 according to the inventive concepts, a contact area between the via electrode portion 282 and the stacked structure of the plurality of lower wiring patterns 242 and the plurality of lower wiring vias 244, which are in the lower wiring structure 240, may be increased to reduce a contact resistance therebetween. Also, because the first lower pattern M1-2 and the second lower pattern M2-2 serve as the etch stop film during the formation of the via hole VH, the via hole VH may be formed by using an etching process having a high etch selectivity. As a result, the reliability of a manufacturing process for forming the image sensor package 1 may be improved.

Figure 2A:
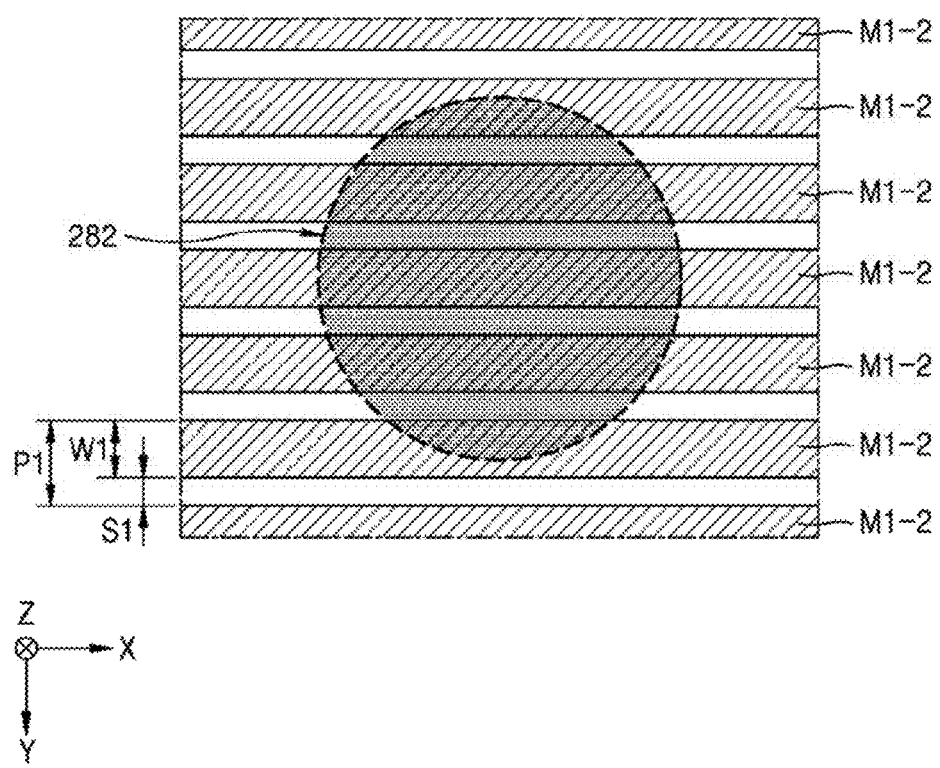
FIGS. 2A, 2B, 2C and 2D are plan views and a cross-sectional view of a second wiring structure included in an image sensor package according to some example embodiments.
Figure 2B:
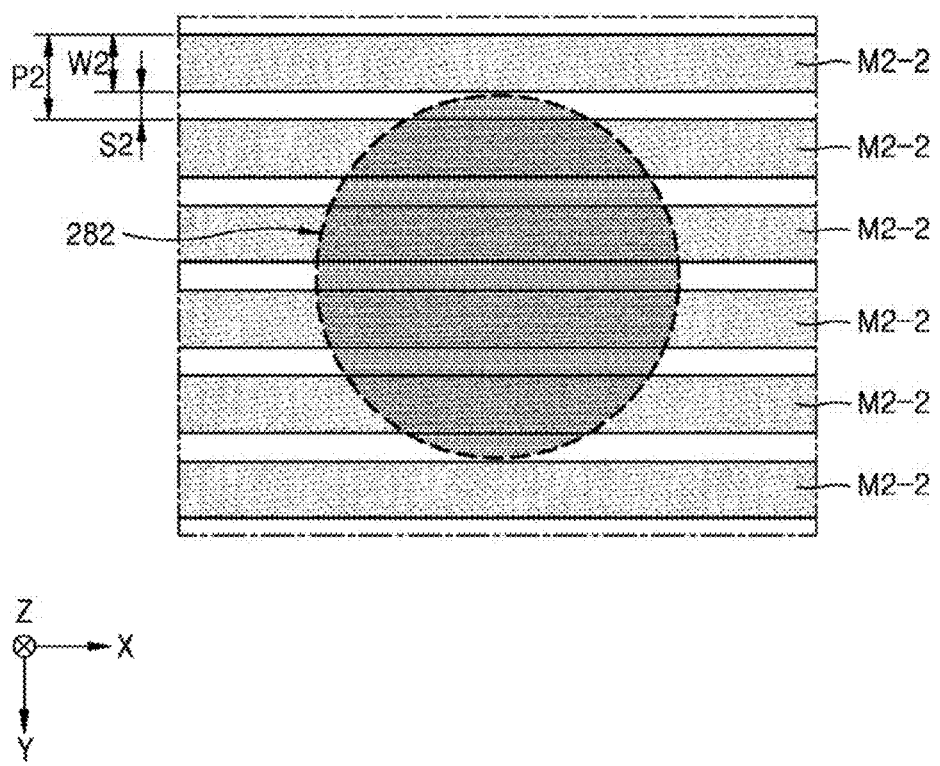
Figure 2C:
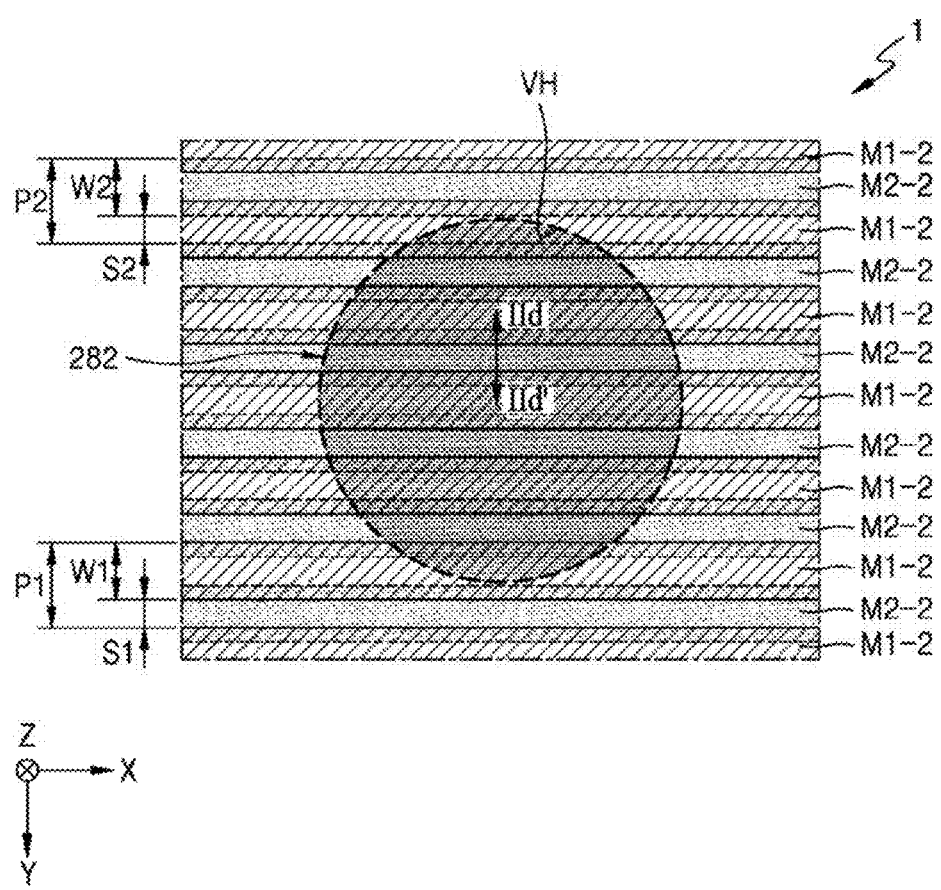
Figure 2D:
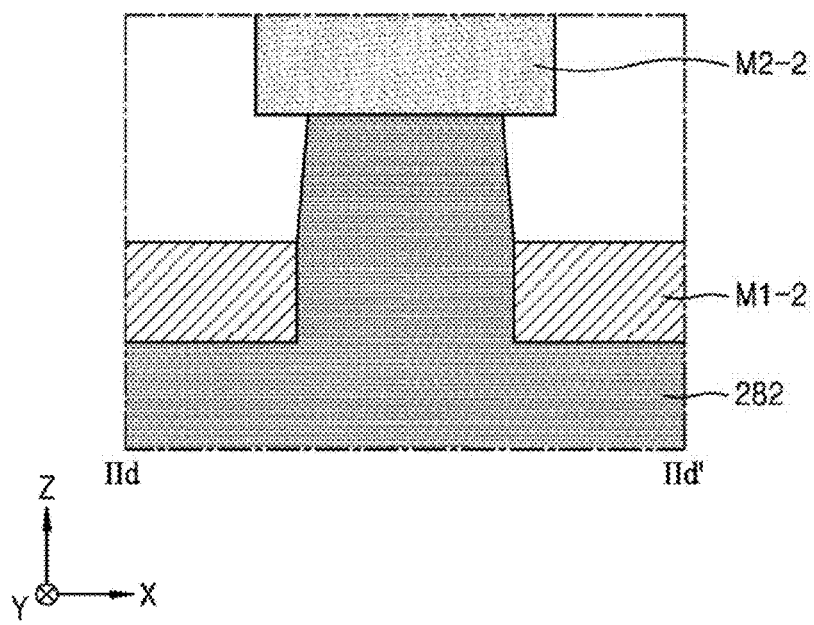

FIGS. 2A to 2D are plan views and a cross-sectional view of a second wiring structure included in an image sensor package according to some example embodiments. Specifically, FIG. 2A is a plan view showing the arrangement of first wiring patterns of the second wiring structure. FIG. 2B is a plan view showing the arrangement of second wiring patterns of the second wiring structure. FIG. 2C is a plan view showing the arrangement of third wiring patterns of the second wiring structure. FIG. 2D is a cross-sectional view taken along line IId-IId' of FIG. 2C, which shows the first and second wiring patterns of the second wiring structure.

Referring to FIGS. 1A to 2D together, the image sensor package 1 may include a plurality of lower wiring patterns 242, which include a plurality of first lower patterns M1-2 and a plurality of second lower patterns M2-2. Each of the plurality of first lower patterns M1-2 and the plurality of second lower patterns M2-2 may be a line pattern.

Each of the plurality of first lower patterns M1-2 may have a first width W1 and a first pitch P1 and extend in one direction. Although FIG. 2A pertains to an example embodiment in which the plurality of first lower patterns M1-2 extend in a first lateral direction (e.g., X direction), the inventive concepts are not limited thereto. For example, the plurality of first lower patterns M1-2 may extend in a second lateral direction (e.g., Y direction), which is perpendicular or substantially perpendicular to the first lateral direction (X direction). The plurality of first lower patterns M1-2 may extend in an oblique direction with respect to the first lateral direction (X direction) and the second lateral direction (Y direction). The plurality of first lower patterns M1-2 may be a first distance S1 apart from each other. The first width W1 may be several μm, and the first distance S1 may be less than the first width W1. For example, the first width W1 may be in a range of about 2 μm to about 6 μm, and the first distance S1 may be in a range of about 1.5 μm to about 4.5 μm. The first pitch P1 may be the sum of the first width W1 and the first distance S1. The first width W1 may be at least 50% of the first pitch P1. For example, at a vertical level at which the plurality of first lower patterns M1-2 are located, a percentage taken by the plurality of first lower patterns M1-2 in the second wiring structure may be at least 50% in a view from above. In some example embodiments, the first width W1 may have a value greater than or equal to about 55% and lower than about 85% of the first pitch P1, and the first distance S1 may have a value greater than about 15% and lower than or equal to about 45% of the first pitch P1. That is, at the vertical level at which the plurality of first lower patterns M1-2 are located, a percentage taken by the plurality of first lower patterns M1-2 may be greater than or equal to about 55% and lower than 85% in a view from above.

Each of the plurality of second lower patterns M2-2 may have a second width W2 and a second pitch P2 and extend in one direction. Although FIG. 2B pertains to an example embodiment in which the plurality of second lower patterns M2-2 extend in the first lateral direction (X direction), the inventive concepts are not limited thereto. For example, the plurality of second lower patterns M2-2 may extend in the second lateral direction (Y direction) or extend in an oblique direction with respect to the first lateral direction (X direction) and the second lateral direction (Y direction). The plurality of second lower patterns M2-2 may be a second distance S2 apart from each other. The second width W2 may be several μm, and the second distance S2 may be less than the second width W2. For example, the second width W2 may be in a range of about 2 μm to about 6 μm, and the second distance S2 may be in a range of about 1.5 μm to about 4.5 μm. The second pitch P2 may be the sum of the second width W2 and the second distance S2. The second width W2 may be at least 50% of the second pitch P2. For example, at a vertical level at which the plurality of second lower patterns M2-2 are located, a percentage taken by the plurality of second lower patterns M2-2 may be at least 50% in a view from above. In some example embodiments, the second width W2 may have a value greater than or equal to about 55% and lower than about 85% of the second pitch P2, and the second distance S2 may have a value greater than about 15% and lower than or equal to about 45% of the second pitch P2. That is, at the vertical level at which the plurality of second lower patterns M2-2 are located, a percentage taken by the plurality of second lower patterns M2-2 may be greater than or equal to about 55% and lower than 85% in a view from above. The first width W1 may be substantially equal to the second width W2, the first distance S1 may be substantially equal to the second distance S2, and the first pitch P1 may be substantially equal to the second pitch P2, but example embodiments are not limited thereto.

In the vertical direction (Z direction), portions of the plurality of first lower patterns M1-2 may overlap portions of the plurality of second lower patterns M2-2. For example, in the vertical direction (Z direction), one of the plurality of first lower patterns M1-2 may overlap portions of two of the plurality of second lower patterns M2-2. In the vertical direction (Z direction), one of the plurality of second lower patterns M2-2 may overlap portions of two of the plurality of first lower patterns M1-2. In the vertical direction (Z direction), respective spaces between the plurality of first lower patterns M1-2 may be entirely overlapped by the plurality of second lower patterns M2-2. In the vertical direction (Z direction), respective spaces between the plurality of second lower patterns M2-2 may be entirely overlapped by the plurality of first lower patterns M1-2. In the vertical direction (Z direction), a bottom surface of a via hole VH may be entirely overlapped by the plurality of first lower patterns M1-2 and the plurality of second lower patterns M2-2. Accordingly, in the vertical direction (Z direction), a via electrode portion 282 in a lower wiring structure 240 may be entirely overlapped by the plurality of first lower patterns M1-2 and the plurality of second lower patterns M2-2.

Therefore, the plurality of first lower patterns M1-2 and the plurality of second lower patterns M2-2 may serve as the etch stop film during the formation of the via hole VH, and thus, the via hole VH may be easily formed. Also, the via electrode portion 282 may be connected to the plurality of first lower patterns M1-2, which are on the bottom surface of the via hole VH, and the plurality of second lower patterns M2-2. As a result, a contact area may be increased to reduce a contact resistance. The via electrode portion 282 may be in contact with and electrically connected to a lower surface and a side surface of the first lower pattern M1-2, which is on the bottom surface of the via hole VH, and a bottom surface of the second lower pattern M2-2.

FIGS. 3A to 3H are cross-sectional views of a method of manufacturing an image sensor package, according to some embodiments. FIGS. 3A to 3H illustrate a method of manufacturing the image sensor package 1 shown in FIGS. 1A to 1C, and the image sensor package 1 shown in FIGS. 1A to 1C is obtained by turning the resultant structure of FIGS. 3A to 3H upside down.

Figure 3A:
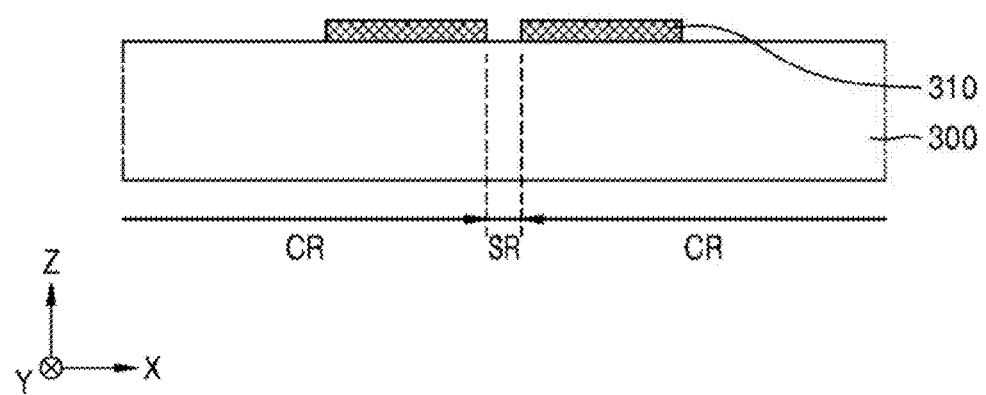
FIGS. 3A, 3B, 3C, 3D, 3E, 3F, 3G and 3H are cross-sectional views of a method of manufacturing an image sensor package, according to some example embodiments.

Referring to FIG. 3A, a dam structure 310 may be adhered onto a glass plate 300. The glass plate 300 may include a plurality of chip regions CR and a scribe lane region SR between the plurality of chip regions CR. Each of the plurality of chip regions CR of the glass plate 300 may correspond to the glass plate 300 included in the image sensor package 1 shown in FIG. 1A. The dam structure 310 may be adhered to the plurality of chip regions CR adjacent to the scribe lane region SR of the glass plate 300. In some example embodiments, the dam structure 310 may be adhered to the glass plate 300 such that the dam structure 310 extends along an edge of each of the plurality of chip regions CR. For example, the dam structure 310 may have a tetragonal ring shape in a view from above.

Figure 3B:
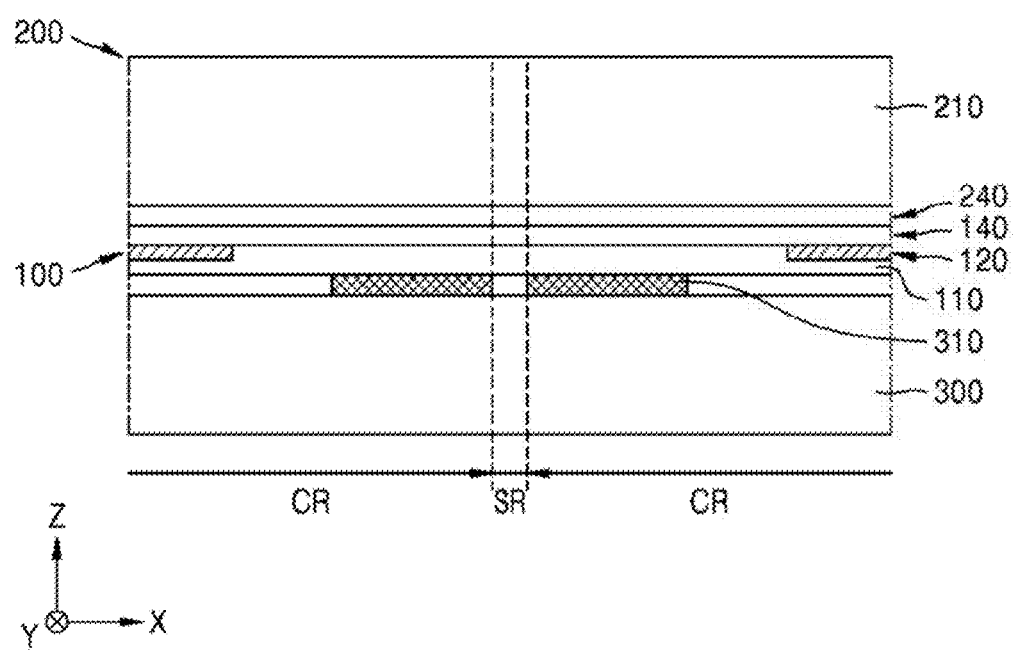

Referring to FIG. 3B, a first substrate portion 100 on which a second substrate portion 200 is stacked may be adhered onto the glass plate 300 to which the dam structure 310 is adhered. The first substrate portion 100 and the second substrate portion 200 may be stacked by using a metal-oxide hybrid bonding technique.

Figure 3C:
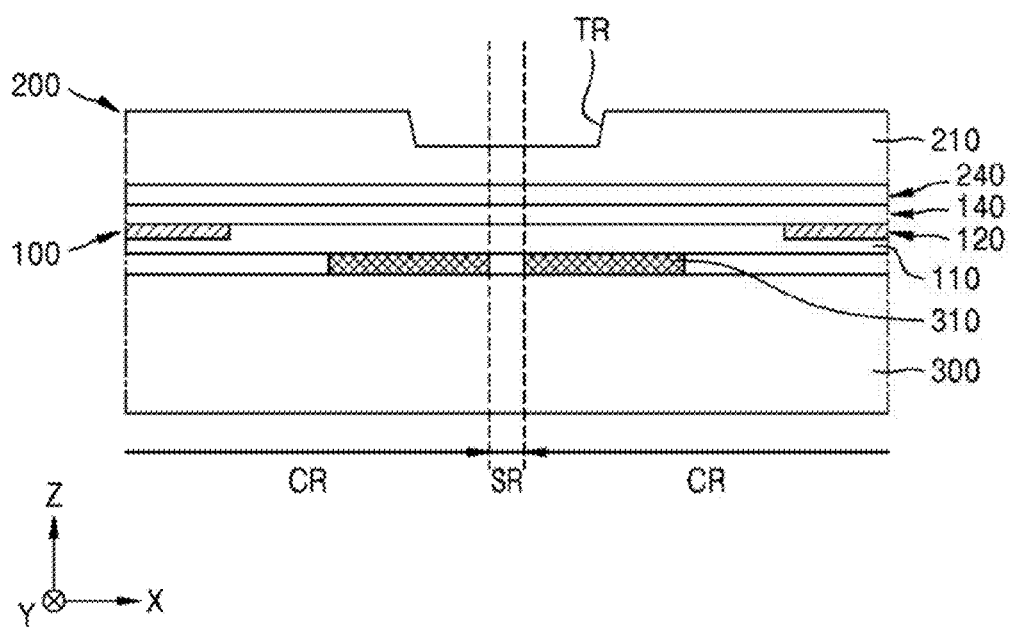

Referring to FIG. 3C, a trench portion TR may be formed by removing a portion of a second substrate 210. The trench portion TR may be formed by removing an upper portion of the second substrate 210, which corresponds to portions of the plurality of chip regions CR adjacent to the scribe lane region SR and the scribe lane region SR.

Figure 3D:
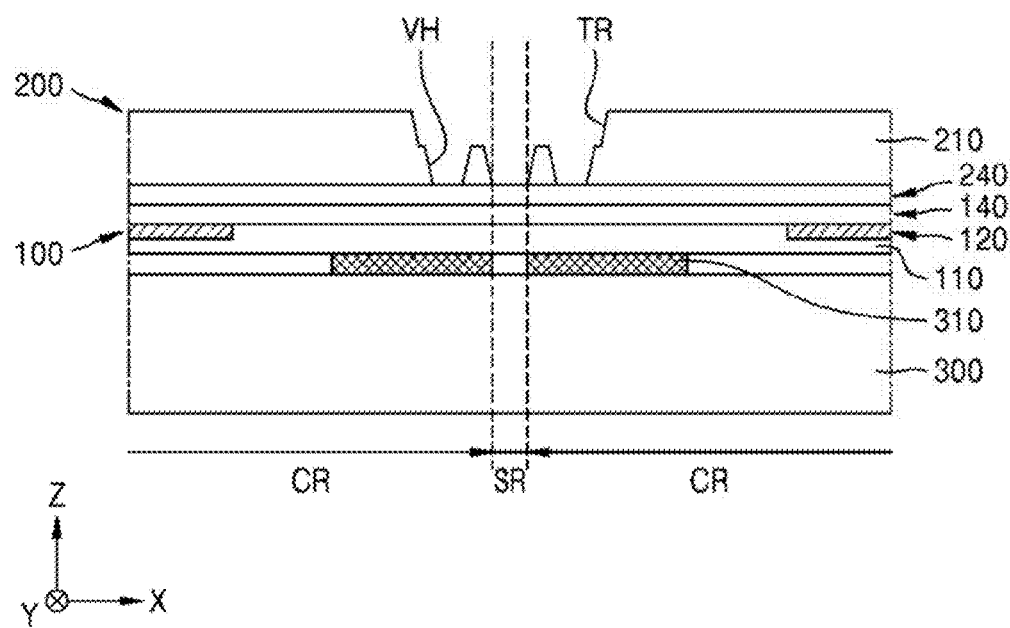

Referring to FIG. 3D, portions of the second substrate 210 may be removed from a bottom surface of the trench portion TR, thereby forming a plurality of via holes VH. The trench portion TR and the plurality of via holes VH may pass through the second substrate 210 together. Each of the plurality of via holes VH may further extend into the lower wiring structure 240 as shown in FIG. 1C.

Figure 3E:
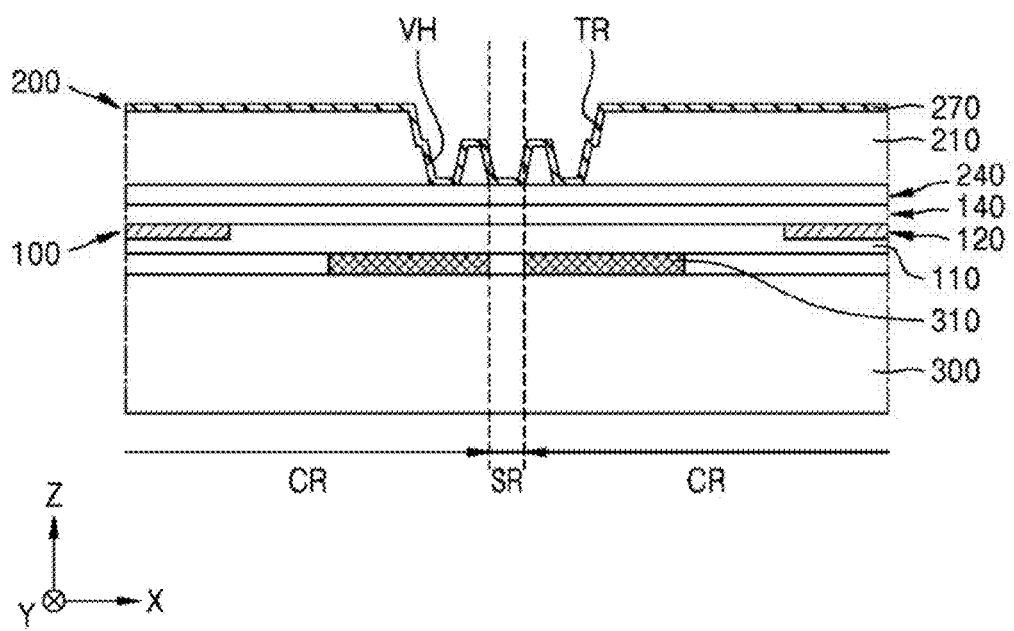

Referring to FIG. 3E, a first passivation layer 270 may be formed to cover an upper surface of the second substrate 210, an inner side surface of the trench portion TR, an inner side surface of each of the plurality of via holes VH, and an upper surface of the lower wiring structure 240, which is exposed at a bottom surface of each of the plurality of via holes VH. The first passivation layer 270 may be formed to conformally cover the upper surface of the second substrate 210, the inner side surface of the trench portion TR, the inner side surface of each of the plurality of via holes VH, and the upper surface of the lower wiring structure 240, which is exposed at the bottom surface of each of the plurality of via holes VH.

The first passivation layer 270 may include, for example, oxide, nitride, oxynitride, or a combination thereof. In some example embodiments, the first passivation layer 270 may be formed to have a stacked structure of hafnium oxide, silicon nitride, and hafnium oxide. For example, the first passivation layer 270 may be formed to a thickness in a range of about 100 mm to about 300 mm.

Figure 3F:
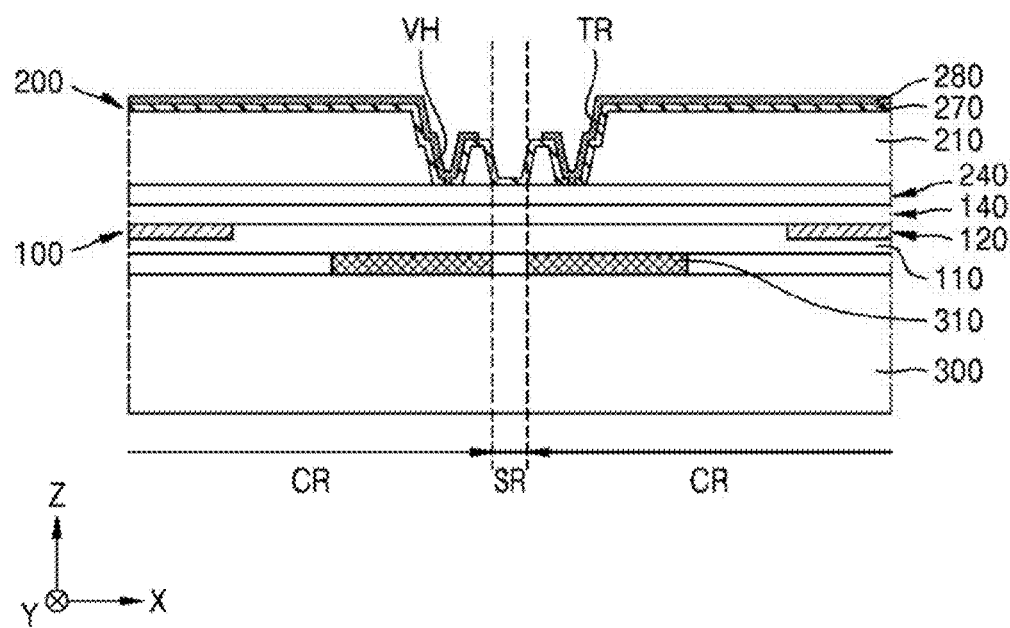

Referring to FIG. 3F, at least a portion of the first passivation layer 270, which covers the upper surface of the lower wiring structure 240 exposed at the bottom surfaces of the plurality of via holes VH, may be removed to expose the lower wiring structure 240. Thereafter, a lower electrode layer 280 may be formed to cover the first passivation layer 270. The lower electrode layer 280 may be in contact with portions of the upper surface of the lower wiring structure 240, which are exposed at the bottom surfaces of the plurality of via holes VH.

The lower electrode layer 280 may include, for example, a metal material, such as titanium, titanium nitride, tantalum, tantalum nitride, titanium tungsten, tungsten, aluminum, cobalt, nickel, and copper, or an alloy material thereof, but example embodiments are not limited thereto. In some example embodiments, the lower electrode layer 280 may be formed by using a CVD process or an ALD process. For example, the lower electrode layer 280 may be formed to a thickness in a range of about 2 μm to about 4 μm.

Figure 3G:
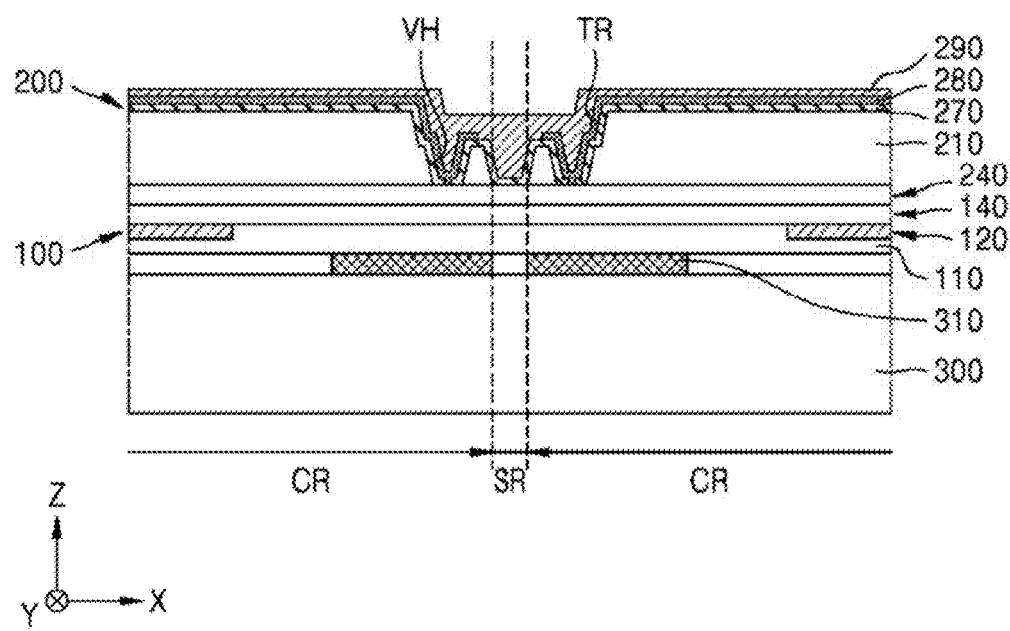

Referring to FIG. 3G, a second passivation layer 290 may be formed to cover the lower electrode layer 280. The second passivation layer 290 may be formed using an insulating material, for example, silicon oxide and silicon nitride. In some example embodiments, the second passivation layer 290 may include TEOS or PE-TEOS.

The second passivation layer 290 may be formed to cover the lower electrode layer 280, fill the via hole VH, and fill at least a portion of the trench portion TR.

Figure 3H:
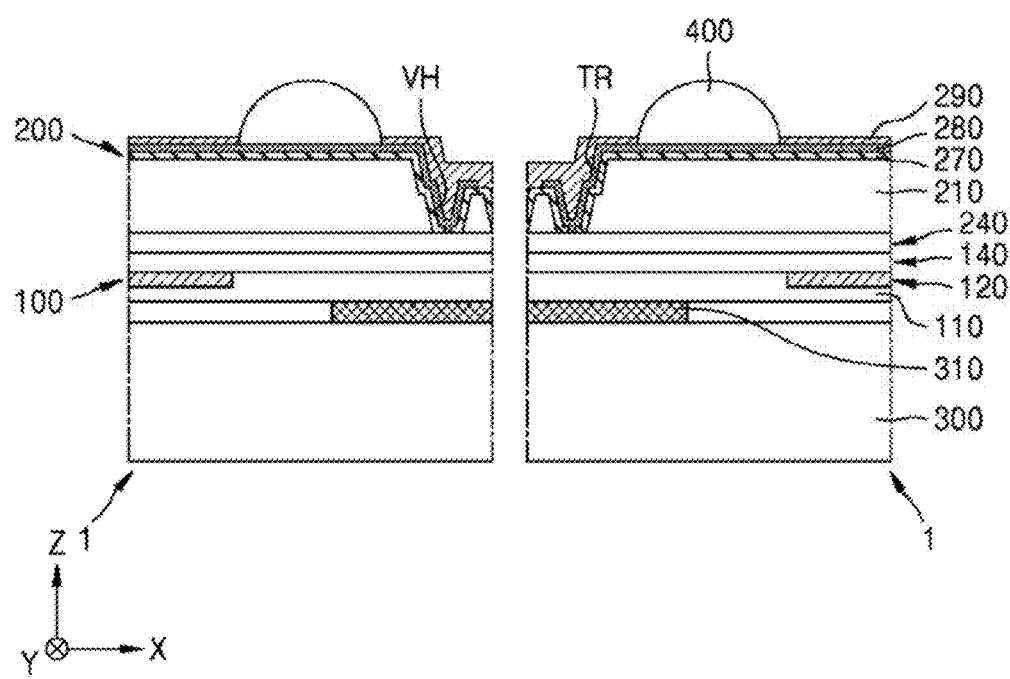

Referring to FIGS. 3G and 3H, portions of the second passivation layer 290, which cover the upper surface of the second substrate 210, may be removed to expose portions of the lower electrode layer 280. Thereafter, a plurality of external connection terminals 400 may be formed to be connected to the lower electrode layer 280.

Thereafter, the plurality of chip regions CR may be separated from each other by removing portions of the second substrate portion 200, the first substrate portion 100, and the glass plate 300, and thus, a plurality of image sensor packages 1 may be formed.

Referring to FIGS. 3A to 3H, in the method of manufacturing the image sensor package 1, according to some example embodiments, the via hole VH may be formed by using an etching process having a high etch selectivity, and thus, the reliability of a manufacturing process may be improved.

Figure 4:
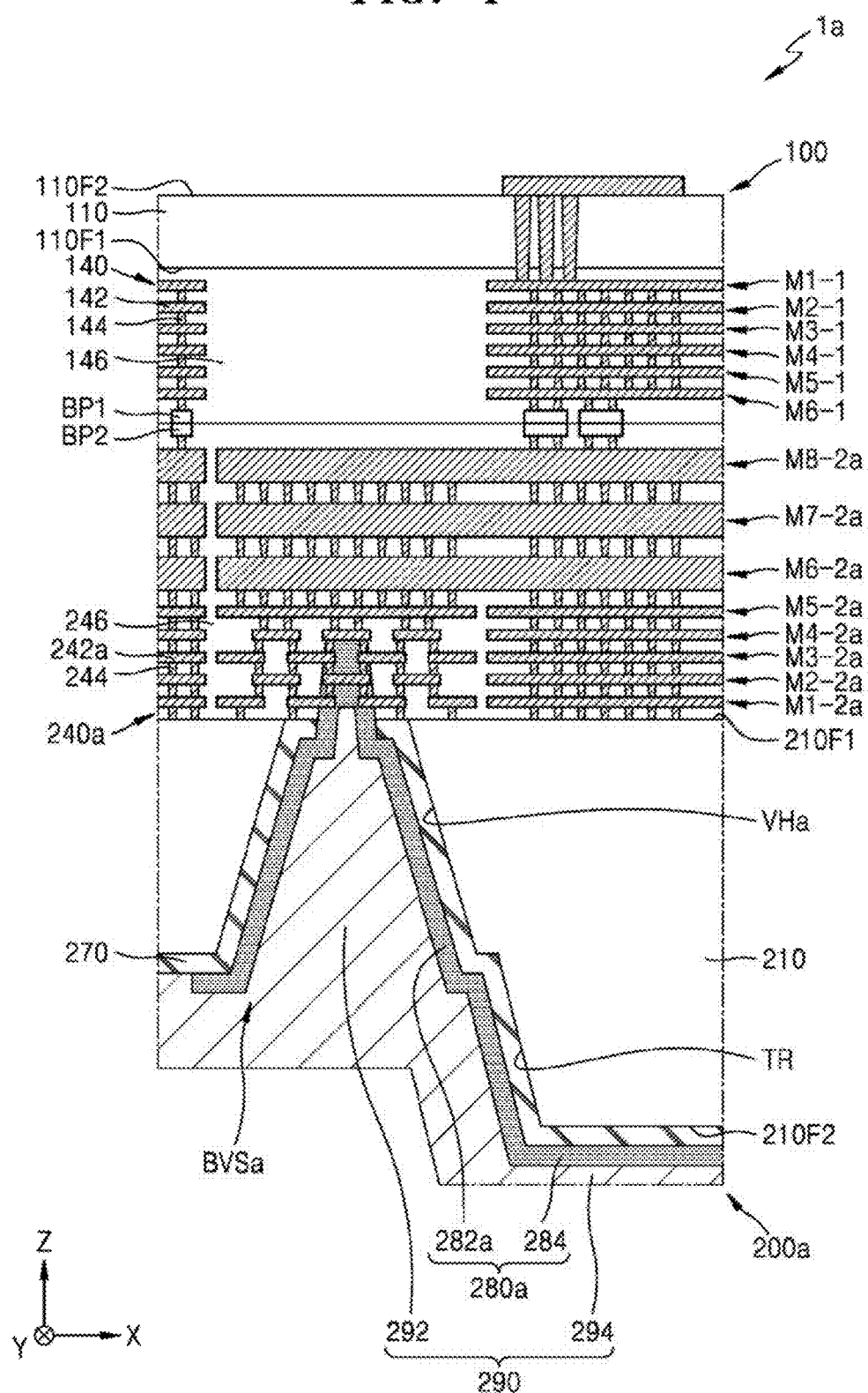
FIG. 4 is a cross-sectional view of a portion of an image sensor package according to some example embodiments.

FIG. 4 is a cross-sectional view of a portion of an image sensor package 1a according to some example embodiments. Specifically, FIG. 4 is an enlarged cross-sectional view of a portion of the image sensor package 1a corresponding to portion IC of FIG. 1A. The same description as in FIGS. 1A to 1C will be omitted from FIG. 4, and FIG. 4 will be described with reference to FIGS. 1A to 1C.

Referring to FIG. 4, the image sensor package 1a may include a first substrate portion 100 and a second substrate portion 200a. The first substrate portion 100 may be substantially the same as the first substrate portion 100 described with reference to FIGS. 1A to 1C.

The second substrate portion 200a may include a second substrate 210 and a lower wiring structure 240a. The second substrate 210 may include a third surface 210F1 and a fourth surface 210F2, which are opposite to each other. The lower wiring structure 240a may be between an upper wiring structure 140 and the second substrate 210.

The lower wiring structure 240a may include a stacked structure of a plurality of lower wiring patterns 242a and a plurality of lower wiring vias 244 and a lower interlayer insulating film 246 configured to surround the plurality of lower wiring patterns 242a and the plurality of lower wiring vias 244.

In some example embodiments, the lower wiring structure 240a may be formed by using a damascene process. In some example embodiments, at least one of the plurality of lower wiring patterns 242a may be integrally formed with at least one of the plurality of lower wiring vias 244. In some example embodiments, each of the plurality of lower wiring patterns 242a and the plurality of lower wiring vias 244 may have a tapered shape of which a lateral width reduces from an upper side to a lower side thereof. That is, the plurality of lower wiring patterns 242a and the plurality of lower wiring vias 244 may increase in lateral width in a direction away from the second substrate 210.

The plurality of lower wiring patterns 242a may include a plurality of lower patterns, which are at different vertical levels. For example, the plurality of lower wiring patterns 242a may include a first lower pattern M1-2a, a second lower pattern M2-2a, a third lower pattern M3-2a, a fourth lower pattern M4-2a, a fifth lower pattern M5-2a, a sixth lower pattern M6-2a, a seventh lower pattern M7-2a, and an eighth lower pattern M8-2a, which are at different vertical levels from each other. For example, the first lower pattern M1-2a, the second lower pattern M2-2a, the third lower pattern M3-2a, the fourth lower pattern M4-2a, the fifth lower pattern M5-2a, the sixth lower pattern M6-2a, the seventh lower pattern M7-2a, and the eighth lower pattern M8-2a may be sequentially arranged in a direction away from the third surface 210F1 of the second substrate 210 in a vertical direction (Z direction).

As used herein, the first lower pattern M1-2a, the second lower pattern M2-2a, the third lower pattern M3-2a, the fourth lower pattern M4-2a, the fifth lower pattern M5-2a, the sixth lower pattern M6-2a, the seventh lower pattern M7-2a, and the eighth lower pattern M8-2a may be referred to as a first wiring pattern M1-2a, a second wiring pattern M2-2a, a third wiring pattern M3-2a, a fourth wiring pattern M4-2a, a fifth wiring pattern M5-2a, a sixth wiring pattern M6-2a, a seventh wiring pattern M7-2a, and an eighth wiring pattern M8-2a, respectively.

The plurality of lower wiring vias 244 may be connected to at least one of the first lower pattern M1-2a, the second lower pattern M2-2a, the third lower pattern M3-2a, the fourth lower pattern M4-2a, the fifth lower pattern M5-2a, the sixth lower pattern M6-2a, the seventh lower pattern M7-2a, and the eighth lower pattern M8-2a.

For example, the plurality of lower wiring patterns 242a may have a thickness in a range of about 80 nm to about 1200 nm. In some example embodiments, from among the plurality of lower wiring patterns 242a, the eighth lower pattern M8-2a may have a greatest thickness, and the first lower pattern M1-2a may have a smallest thickness, but example embodiments are not limited thereto.

The lower interlayer insulating film 246 on the third surface 210F1 of the second substrate 210 may the plurality of lower wiring patterns 242a and the plurality of lower wiring vias 244. The lower interlayer insulating film 246 may include an insulating material, such as silicon oxide, silicon nitride, and silicon oxynitride.

In some example embodiments, the lower wiring structure 240a may include a plurality of second bonding pads BP2. The plurality of second bonding pads BP2 may be electrically connected to the plurality of lower wiring patterns 242a and the plurality of lower wiring vias 244. For example, each of the plurality of second bonding pads BP2 may be connected to at least one of the plurality of lower wiring vias 244. The plurality of second bonding pads BP2 may be on an upper surface of the lower wiring structure 240a, which faces the upper wiring structure 140. A first bonding pad BP1 and the second bonding pad BP2, which correspond to each other, may form a combination pad BP.

The second substrate portion 200a may include a lower electrode layer 280a, which passes through the second substrate 210 and be connected to the lower wiring structure 240a, a first passivation layer 270 between the lower electrode layer 280a and the second substrate 210, and a second passivation layer 290 covering the lower electrode layer 280a.

The second substrate 210 may have a trench portion TR and a via hole VHa. The trench portion TR may extend into the fourth surface 210F2 of the second substrate 210. The via hole VHa may extend from a bottom surface of the trench portion TR to the third surface 210F1 of the second substrate 210. Although FIG. 4 pertains to an example in which the second substrate 210 has one via hole VHa, the inventive concepts are not limited thereto. For example, the second substrate 210 may have a plurality of via holes VHa, which extend from the bottom surface of the trench portion TR to the third surface 210F1 of the second substrate 210. The via hole VHa may further extend into the lower wiring structure 240a from the third surface 210F1 of the second substrate 210. For example, the via hole VH may be formed by removing a portion of the second substrate 210 and a portion of the lower interlayer insulating film 246. Portions of the plurality of lower wiring patterns 242a may be exposed inside the via hole VHa. For example, the first lower pattern M1-2a, the second lower pattern M2-2a, the third lower pattern M3-2a, and the fourth lower pattern M4-2a may be exposed inside the via hole VHa. The first lower pattern M1-2a, the second lower pattern M2-2a, the third lower pattern M3-2a, and the fourth lower pattern M4-2a may serve as an etch stop film during the formation of the via hole VHa.

The first passivation layer 270 may cover an inner sidewall of the trench portion TR, an inner sidewall of the via hole VHa, and the fourth surface 210F2 of the second substrate 210. In some embodiments, the first passivation layer 270 may cover a portion of the bottom surface of the trench portion TR.

The lower electrode layer 280a may cover the first passivation layer 270. The lower electrode layer 280a may pass through the first passivation layer 270 and be connected to the lower wiring structure 240a. For example, the lower electrode layer 280a may be connected to some of the plurality of lower wiring patterns 242a. For example, the lower electrode layer 280a may be in contact with and electrically connected to the first lower pattern M1-2a, the second lower pattern M2-2a, the third lower pattern M3-2a, and the fourth lower pattern M4-2a.

The lower electrode layer 280a may include a via electrode portion 282a and a back wiring portion 284. The via electrode portion 282a may be electrically connected to the back wiring portion 284. The via electrode portion 282a may be a portion of the lower electrode layer 280a, which covers the inner sidewall and the bottom surface of the via hole VHa and is connected to some of the plurality of lower wiring patterns 242a. For example, the via electrode portion 282a may be in contact with and electrically connected to the first lower pattern M1-2a, the second lower pattern M2-2a, the third lower pattern M3-2a, and the fourth lower pattern M4-2a. The back wiring portion 284 may be a portion of the lower electrode layer 280a, which is on a portion of the first passivation layer 270 that covers the fourth surface 210F2 of the second substrate 210. For example, the back wiring portion 284 may be a line pattern. In some example embodiments, the back wiring portion 284 may extend from a portion of the first passivation layer 270, which covers the fourth surface 210F2 of the second substrate 210, to a portion of the first passivation layer 270, which covers a side surface of the trench portion TR, and be connected to the via electrode portion 282a.

The second passivation layer 290 may cover the lower electrode layer 280a. The lower electrode layer 280a may be between the first passivation layer 270 and the second passivation layer 290. The second passivation layer 290 may include a buried portion 292 and a back passivation portion 294. The buried portion 292 may be a portion of the second passivation layer 290, which covers the via electrode portion 282a and fills the via hole VHa. The back passivation portion 294 may be a portion of the second passivation layer 290, which covers the back wiring portion 284. For example, the back passivation portion 294 may fill at least a portion of the trench portion TR and cover the fourth surface 210F2 of the second substrate 210.

The via electrode portion 282a and the buried portion 292 may be collectively referred to as a via electrode structure BVSa. The via electrode structure BVSa may be referred to as a back via stack.

The image sensor package 1a may include the via electrode structure BVSa, which includes the via electrode portion 282a that covers the inner sidewall and the bottom surface of the via hole VHa. During the formation of the via hole VHa, the first lower pattern M1-2a, the second lower pattern M2-2a, the third lower pattern M3-2a, and the fourth lower pattern M4-2a may serve as an etch stop film, and the via electrode portion 282a may be connected to the first lower pattern M1-2a, the second lower pattern M2-2a, the third lower pattern M3-2a, and the fourth lower pattern M4-2a.

Accordingly, in the image sensor package 1a according to some example embodiments, a contact area between the via electrode portion 282a and the stacked structure of the plurality of lower wiring patterns 242a and the plurality of lower wiring vias 244, which is included in the lower wiring structure 240a, may be increased to reduce a contact resistance therebetween. Furthermore, because the first lower pattern M1-2a, the second lower pattern M2-2a, the third lower pattern M3-2a, and the fourth lower pattern M4-2a serve as the etch stop film during the formation of the via hole VHa, the via hole VHa may be formed by using an etching process having a high etch selectivity. Therefore, the reliability of a process of manufacturing the image sensor package 1a may be improved.

Figure 5A:
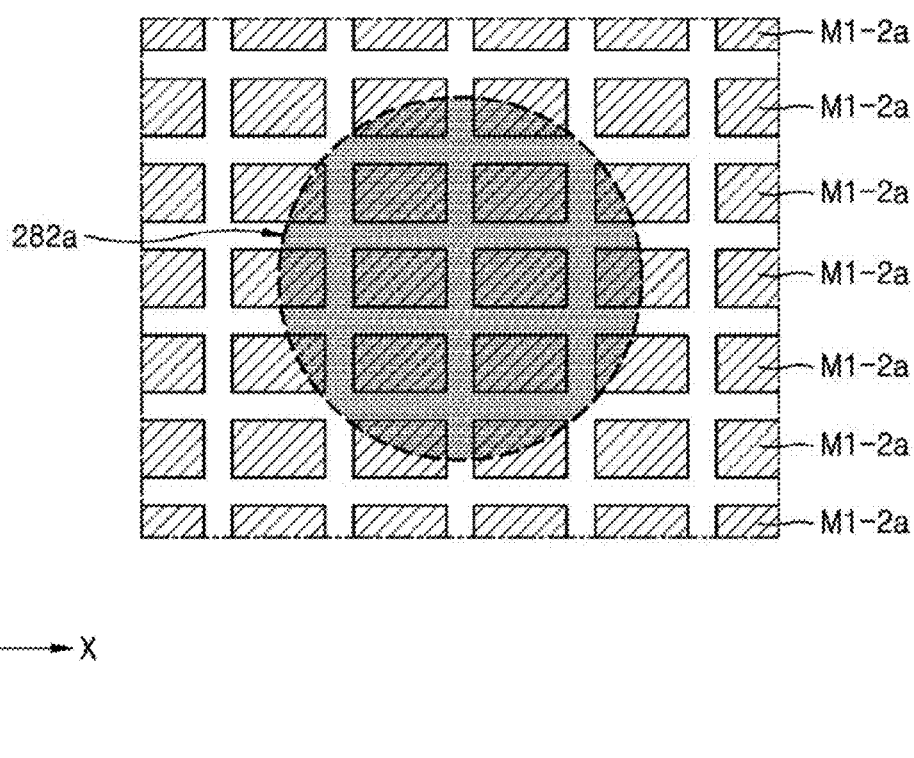
FIGS. 5A, 5B, 5C, 5D and 5E are plan views of a second wiring structure included in an image sensor package according to some example embodiments.
Figure 5B:
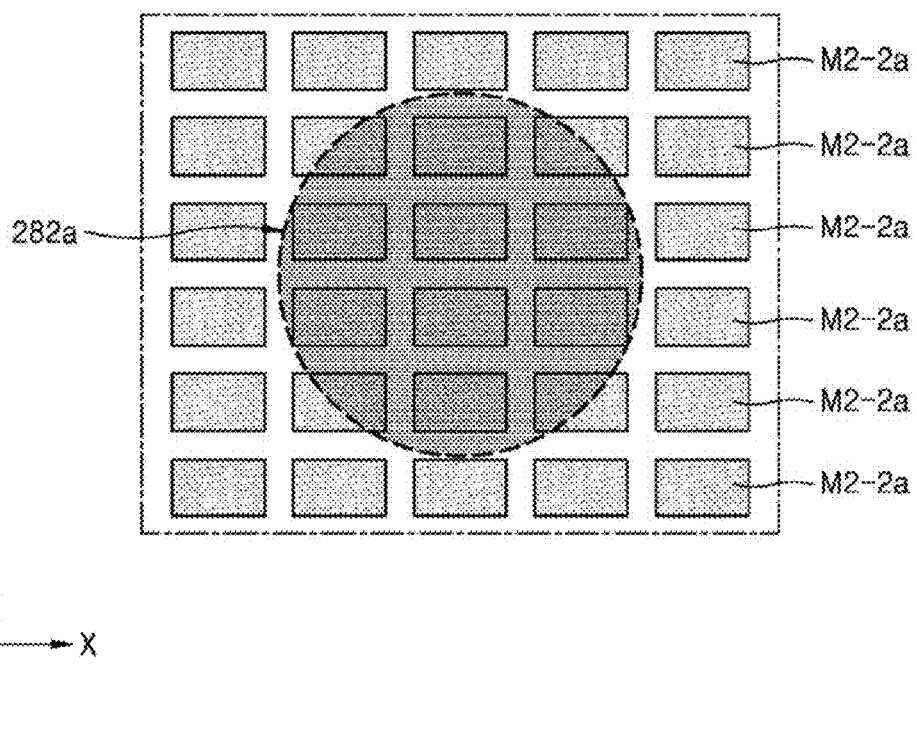
Figure 5C:
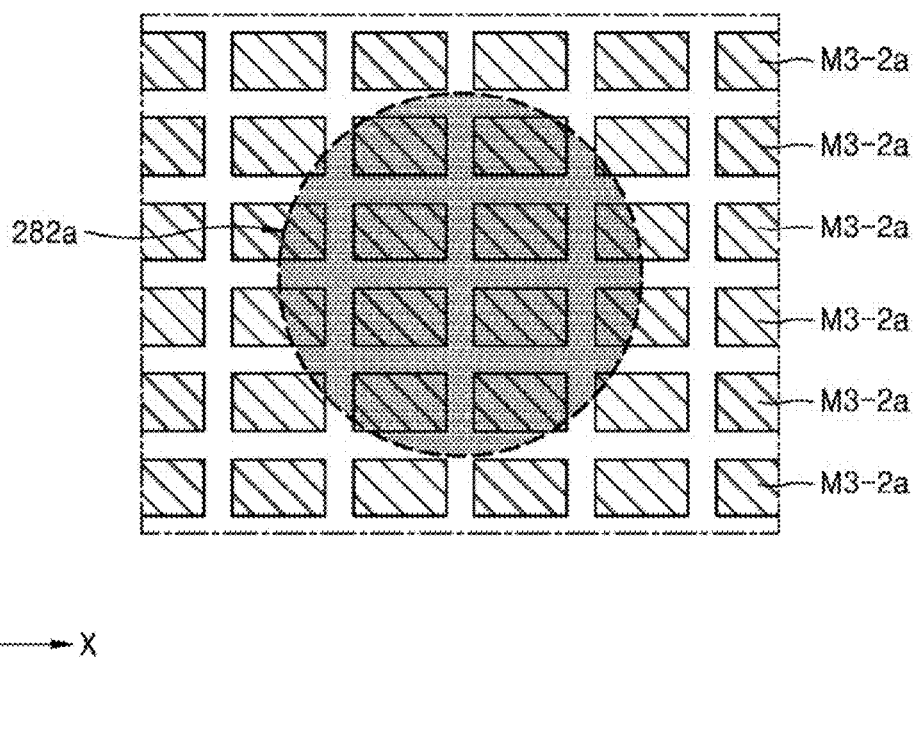
Figure 5D:
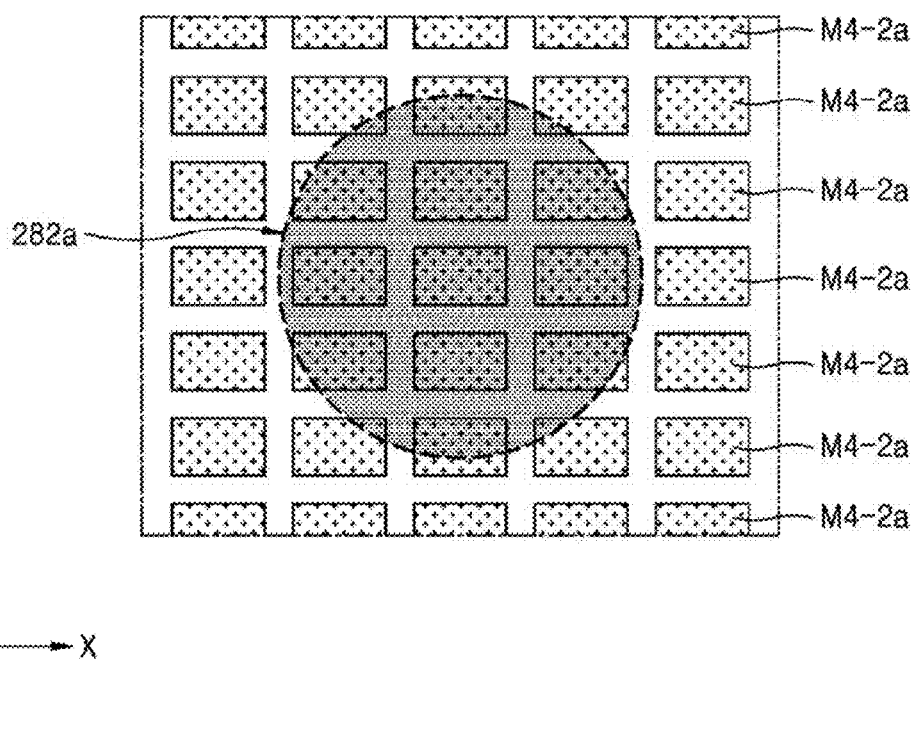
Figure 5E:
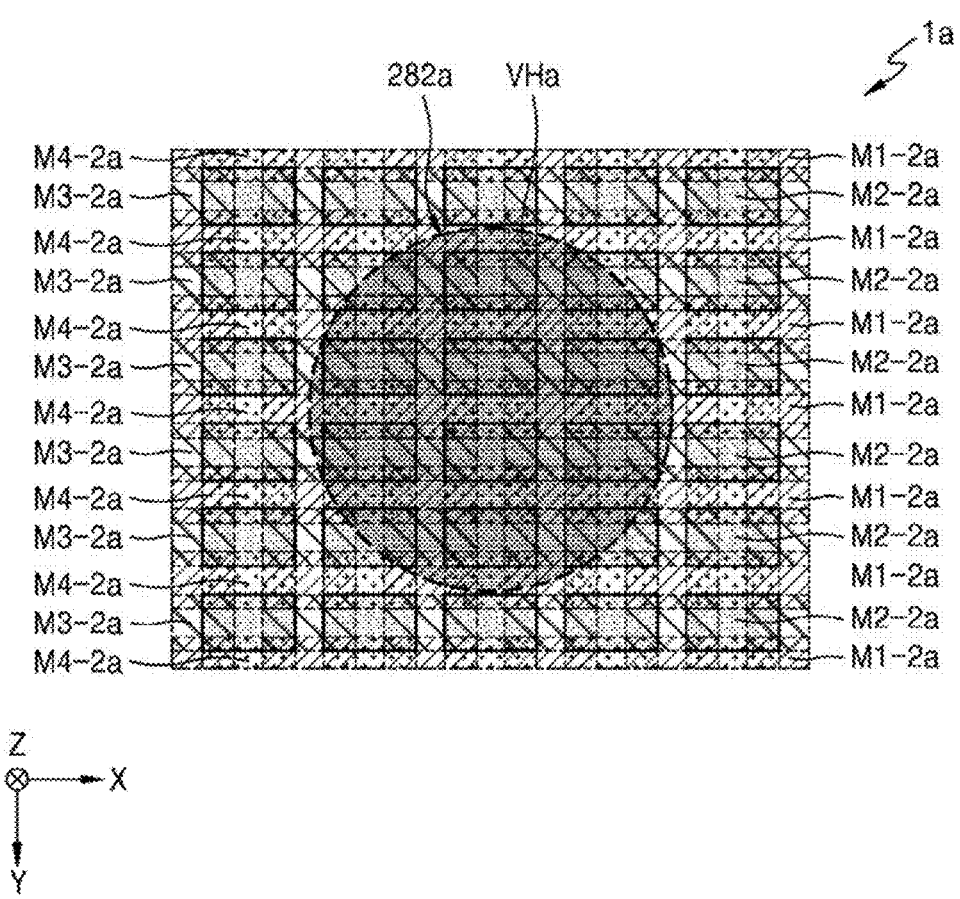

FIGS. 5A to 5E are plan views of a second wiring structure included in an image sensor package 1a according to some example embodiments. Specifically, FIG. 5A is a plan view showing the arrangement of first wiring patterns of the second wiring structure. FIG. 5B is a plan view showing the arrangement of second wiring patterns of the second wiring structure. FIG. 5C is a plan view showing the arrangement of third wiring patterns of the second wiring structure. FIG. 5D is a plan view showing the arrangement of fourth wiring patterns of the second wiring structure. FIG. 5E is a plan view showing the arrangement of the first to fourth wiring patterns of the second wiring structure.

Referring to FIGS. 4 to 5E together, the image sensor package 1a may include a plurality of lower wiring patterns 242a, which include a plurality of first lower patterns M1-2a, a plurality of second lower patterns M2-2a, a plurality of third lower patterns M3-2a, and a plurality of fourth lower patterns M4-2a. Each of the plurality of first lower patterns M1-2a, the plurality of second lower patterns M2-2a, the plurality of third lower patterns M3-2a, and the plurality of fourth lower patterns M4-2a may be a tetragonal pattern. For example, each of the plurality of first lower patterns M1-2a, the plurality of second lower patterns M2-2a, the plurality of third lower patterns M3-2a, and the plurality of fourth lower patterns M4-2a may have a pattern of a square shape, a rectangular shape, a square shape with rounded corners, or a rectangular shape with rounded corners, but example embodiments are not limited thereto.

The plurality of first lower patterns M1-2a may be arranged apart from each other in a first lateral direction (X direction) and a second lateral direction (Y direction) and arranged in a matrix form in a view from above. The plurality of first lower patterns M1-2a may have a width of several μm and be arranged a distance of several μm apart from each other in each of the first lateral direction (X direction) and the second lateral direction (Y direction). The width of each of the plurality of first lower patterns M1-2a may be greater than a distance between the plurality of first lower patterns M1-2a. At a vertical level at which the plurality of first lower patterns M1-2a are located, a percentage taken by (e.g., occupied by) the plurality of first lower patterns M1-2a may be at least 25% in a view from above (e.g., in a lateral cross section area). In some example embodiments, at the vertical level at which the plurality of first lower patterns M1-2a are located, a percentage taken by the plurality of first lower patterns M1-2a may be greater than or equal to about 25% and lower than about 45% in a view from above.

The plurality of second lower patterns M2-2a may be arranged apart from each other in the first lateral direction (X direction) and the second lateral direction (Y direction) and arranged in a matrix form in a view from above. The plurality of second lower patterns M2-2a may have a width of several μm and be arranged a distance of several μm apart from each other in each of the first lateral direction (X direction) and the second lateral direction (Y direction). The width of each of the plurality of second lower patterns M2-2a may be greater than a distance between the plurality of second lower patterns M2-2a. At a vertical level at which the plurality of second lower patterns M2-2a are located, a percentage taken by the plurality of second lower patterns M2-2a may be at least 25% in a view from above. In some example embodiments, at the vertical level at which the plurality of second lower patterns M2-2a are located, a percentage taken by the plurality of second lower patterns M2-2a may be greater than or equal to about 25% and lower than about 45% in a view from above.

The plurality of third lower patterns M3-2a may be arranged apart from each other in the first lateral direction (X direction) and the second lateral direction (Y direction) and arranged in a matrix form in a view from above. The plurality of third lower patterns M3-2a may have a width of several μm and be arranged a distance of several μm apart from each other in each of the first lateral direction (X direction) and the second lateral direction (Y direction). The width of each of the plurality of third lower patterns M3-2a may be greater than a distance between the plurality of third lower patterns M3-2a. At a vertical level at which the plurality of third lower patterns M3-2a are located, a percentage taken by the plurality of third lower patterns M3-2a may be at least 25% in a view from above. In some example embodiments, at the vertical level at which the plurality of third lower patterns M3-2a are located, a percentage taken by the plurality of third lower patterns M3-2a may be greater than or equal to about 25% and lower than about 45% in a view from above.

The plurality of fourth lower patterns M4-2a may be arranged apart from each other in the first lateral direction (X direction) and the second lateral direction (Y direction) and arranged in a matrix form in a view from above. The plurality of fourth lower patterns M4-2a may have a width of several μm and be arranged a distance of several μm apart from each other in each of the first lateral direction (X direction) and the second lateral direction (Y direction). The width of each of the plurality of fourth lower patterns M4-2a may be greater than a distance between the plurality of fourth lower patterns M4-2a. At a vertical level at which plurality of fourth lower patterns M4-2a are located, a percentage taken by the plurality of fourth lower patterns M4-2a may be at least 25% in a view from above. In some example embodiments, at the vertical level at which the plurality of fourth lower patterns M4-2a are located, a percentage taken by the plurality of fourth lower patterns M4-2a may be greater than or equal to about 25% and lower than about 45% in a view from above.

In a vertical direction (Z direction), at least two of portions of the plurality of first lower patterns M1-2a, portions of the plurality of second lower patterns M2-2a, portions of the plurality of third lower patterns M3-2a, and portions of the plurality of fourth lower patterns M4-2a may overlap each other. For example, in the vertical direction (Z direction), one of the plurality of first lower patterns M1-2a may overlap portions of two of the plurality of second lower patterns M2-2a, portions of two of the plurality of third lower patterns M3-2a, and portions of two of the plurality of fourth lower patterns M4-2a. In the vertical direction (Z direction), one of the plurality of second lower patterns M2-2a may overlap portions of two of the plurality of first lower patterns M1-2a, portions of two of the plurality of third lower patterns M3-2a, and portions of two of the plurality of fourth lower patterns M4-2a. In the vertical direction (Z direction), one of the plurality of third lower patterns M3-2a may overlap portions of two of the plurality of first lower patterns M1-2a, portions of two of the plurality of second lower patterns M2-2a, and portions of two of the plurality of fourth lower patterns M4-2a. In the vertical direction (Z direction), one of the plurality of fourth lower patterns M4-2a may overlap portions of two of the plurality of first lower patterns M1-2a, portions of two of the plurality of second lower patterns M2-2a, and portions of two of the plurality of third lower patterns M3-2a.

In the vertical direction (Z direction), respective spaces between the plurality of first lower patterns M1-2a may be entirely overlapped by the plurality of second lower patterns M2-2a, the plurality of third lower patterns M3-2a, and the plurality of fourth lower patterns M4-2a. In the vertical direction (Z direction), respective spaces between the plurality of second lower patterns M2-2a may be entirely overlapped by the plurality of first lower patterns M1-2a, the plurality of third lower patterns M3-2a, and the plurality of fourth lower patterns M4-2a. In the vertical direction (Z direction), respective spaces between the plurality of third lower patterns M3-2a may be entirely overlapped by the plurality of first lower patterns M1-2a, the plurality of second lower patterns M2-2a, and the plurality of fourth lower patterns M4-2a. In the vertical direction (Z direction), respective spaces between the plurality of fourth lower patterns M4-2a may be entirely overlapped by the plurality of first lower patterns M1-2a, the plurality of second lower patterns M2-2a, and the plurality of third lower patterns M3-2a.

In the vertical direction (Z direction), a bottom surface of a via hole VHa may be entirely overlapped by the plurality of first lower patterns M1-2a, the plurality of second lower patterns M2-2a, the plurality of third lower patterns M3-2a, and the plurality of fourth lower patterns M4-2a. Accordingly, in the vertical direction (Z direction), a via electrode portion 282a in the lower wiring structure 240a may be entirely overlapped by the plurality of first lower patterns M1-2a, the plurality of second lower patterns M2-2a, the plurality of third lower patterns M3-2a, and the plurality of fourth lower patterns M4-2a.

Therefore, during the formation of the via hole VHa, the plurality of first lower patterns M1-2a, the plurality of second lower patterns M2-2a, the plurality of third lower patterns M3-2a, and the plurality of fourth lower patterns M4-2a may serve as the etch stop film. Thus, the via hole VHa may be easily formed. In addition, the via electrode portion 282a may be connected to the plurality of first lower patterns M1-2a, the plurality of second lower patterns M2-2a, the plurality of third lower patterns M3-2a, and the plurality of fourth lower patterns M4-2a, which are at the bottom surface of the via hole VHa. Thus, a contact area may be increased to reduce a contact resistance. The via electrode portion 282a may be in contact with and electrically connected to a lower surface and a side surface of each of the plurality of first lower patterns M1-2a, a lower surface and a side surface of each of the plurality of second lower patterns M2-2a, a lower surface and a side surface of each of the plurality of third lower patterns M3-2a, and a lower surface of each of the plurality of fourth lower patterns M4-2a.

Figure 6A:
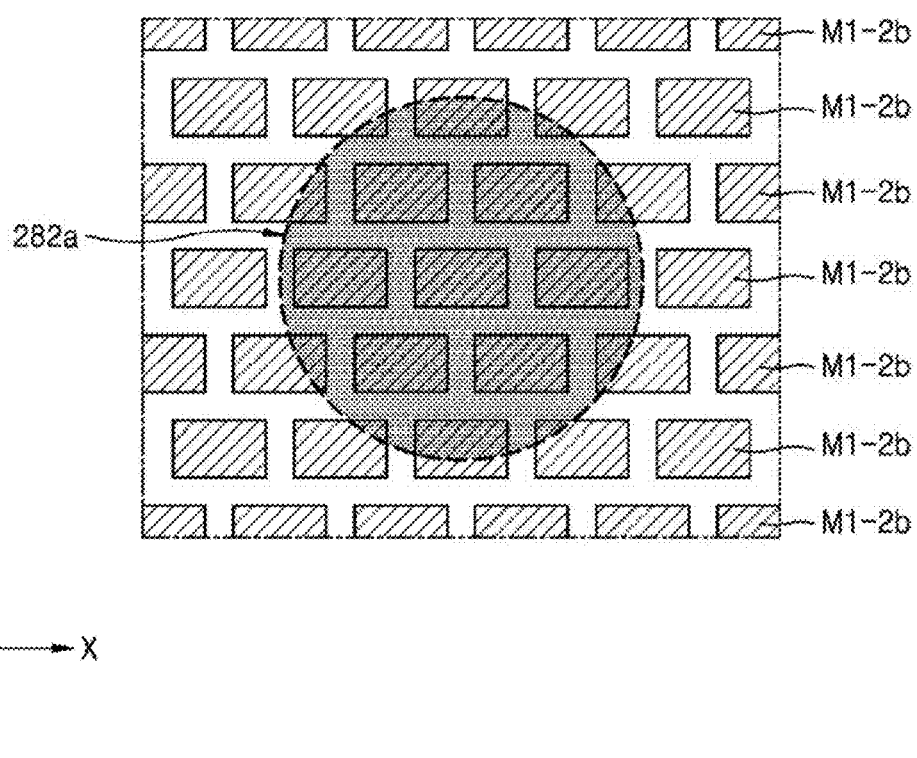
FIGS. 6A, 6B, 6C, 6D and 6E are plan views of a second wiring structure included in an image sensor package, according to some example embodiments.
Figure 6B:
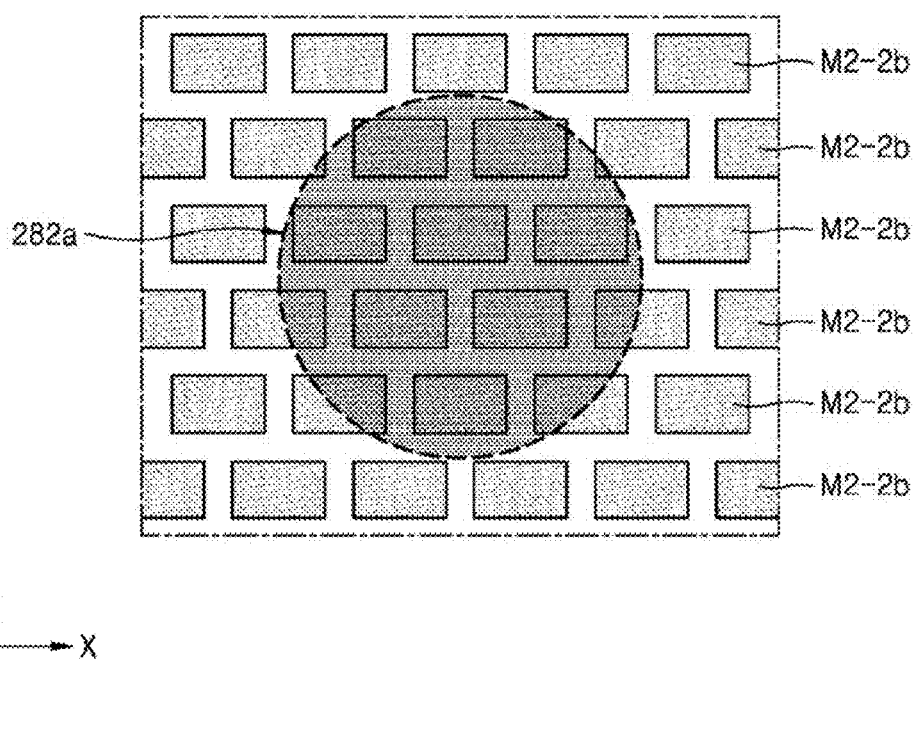
Figure 6C:
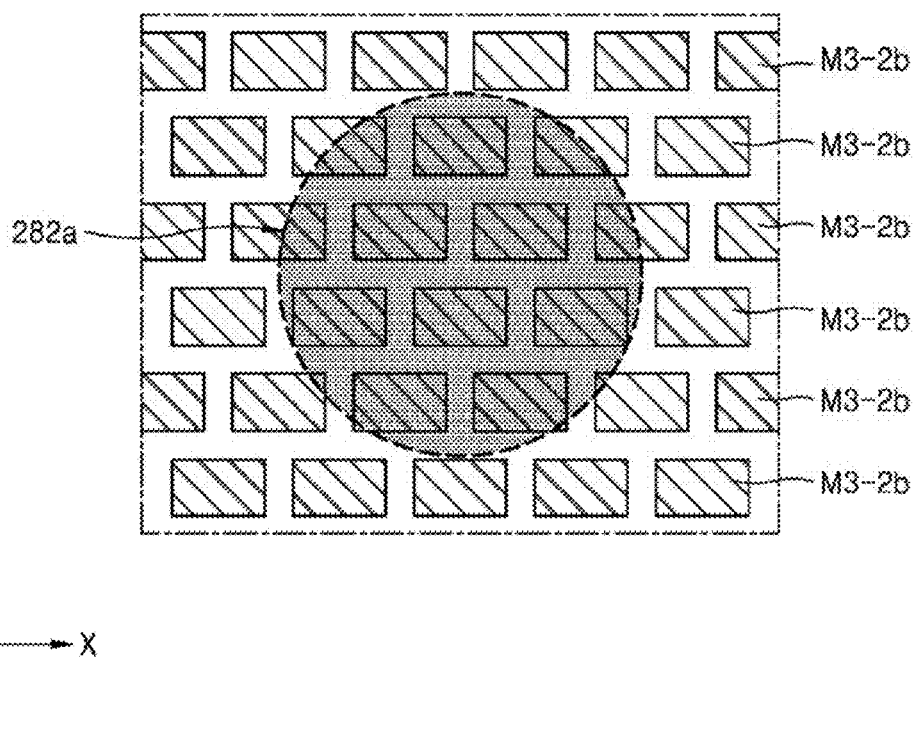
Figure 6D:
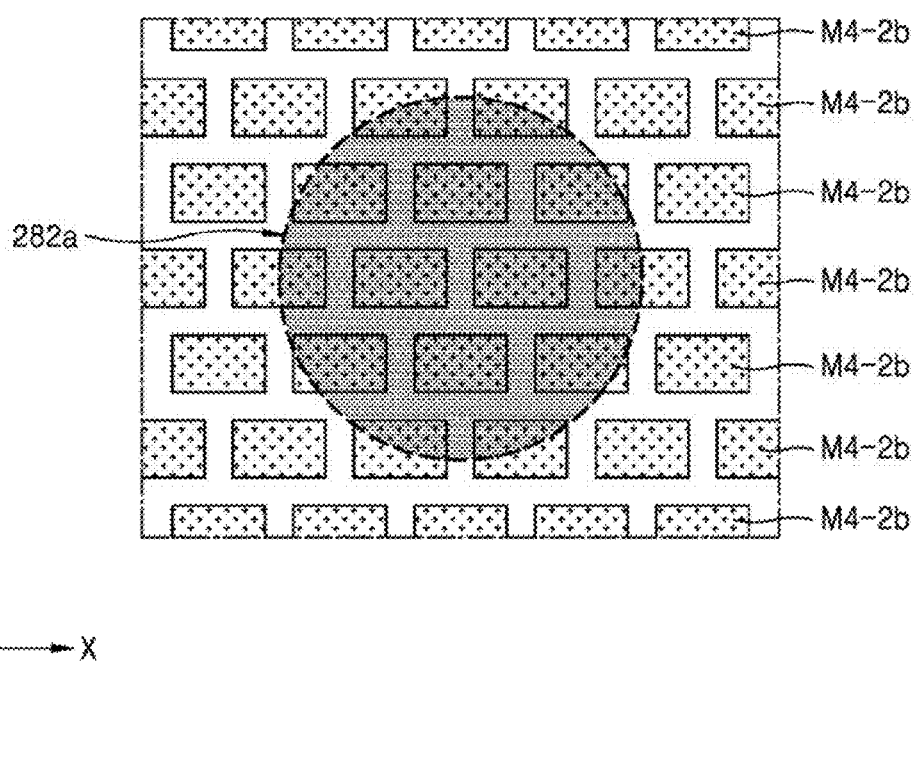
Figure 6E:
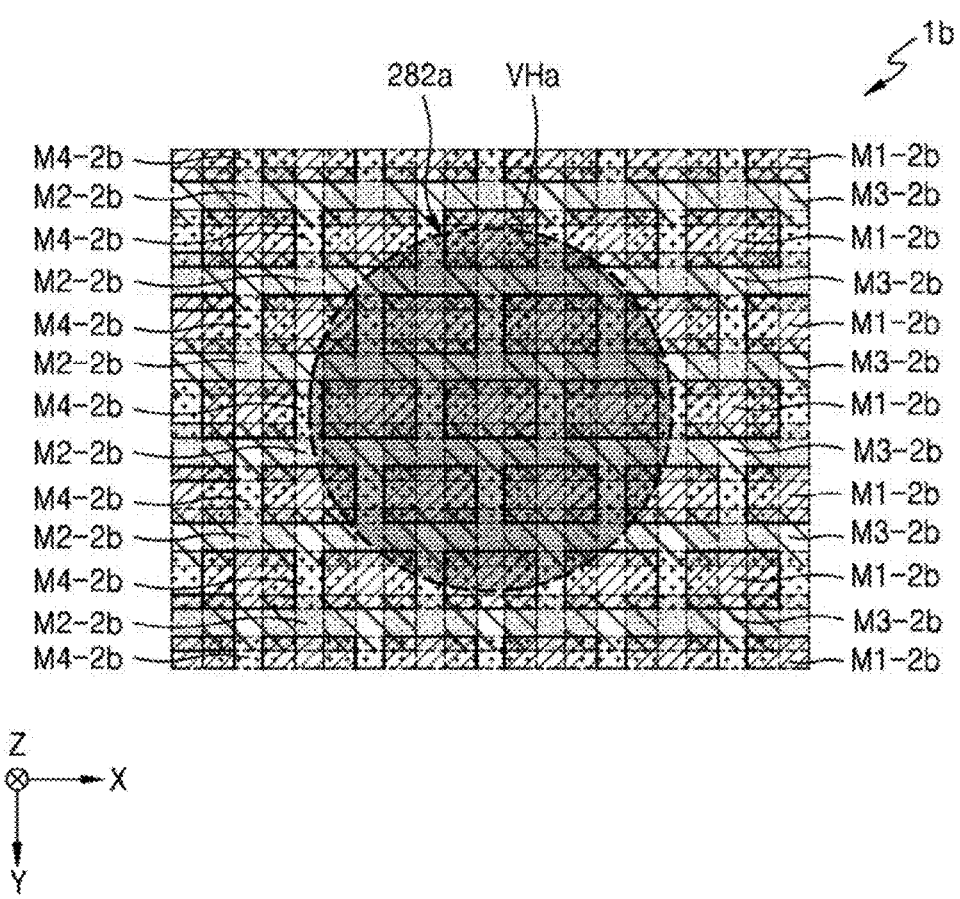

FIGS. 6A to 6E are plan views of a second wiring structure included in an image sensor package 1b, according to some embodiments. Specifically, FIG. 6A is a plan view showing the arrangement of first wiring patterns of the second wiring structure. FIG. 6B is a plan view showing the arrangement of second wiring patterns of the second wiring structure. FIG. 6C is a plan view showing the arrangement of third wiring patterns of the second wiring structure. FIG. 6D is a plan view showing the arrangement of fourth wiring patterns of the second wiring structure. FIG. 6E is a plan view showing the arrangement of the first to fourth wiring patterns of the second wiring structure.

Referring to FIGS. 6A to 6E together, the image sensor package 1b may include a plurality of first lower patterns M1-2b, a plurality of second lower patterns M2-2b, a plurality of third lower patterns M3-2b, and a plurality of fourth lower patterns M4-2b. The image sensor package 1b may be substantially the same as the image sensor package 1a shown in FIGS. 4 to 5E except that the image sensor package 1b includes the plurality of first lower patterns M1-2b, the plurality of second lower patterns M2-2b, the plurality of third lower patterns M3-2b, and the plurality of fourth lower patterns M4-2b instead of the plurality of first lower patterns M1-2a, the plurality of second lower patterns M2-2a, the plurality of third lower patterns M3-2a, and the plurality of fourth lower patterns M4-2a, which are in the image sensor package 1a shown in FIGS. 4 to 5E. Thus, repeated descriptions will be omitted.

Each of the plurality of first lower patterns M1-2b, the plurality of second lower patterns M2-2b, the plurality of third lower patterns M3-2b, and the plurality of fourth lower patterns M4-2b may be a tetragonal pattern. For example, each of the plurality of first lower patterns M1-2b, the plurality of second lower patterns M2-2b, the plurality of third lower patterns M3-2b, and the plurality of fourth lower patterns M4-2b may have a pattern of a square shape, a rectangular shape, a square shape with rounded corners, or a rectangular shape with rounded corners, but example embodiments are not limited thereto.

The plurality of first lower patterns M1-2b may be apart from each other in a first lateral direction (X direction) and arranged in zigzag apart from each other in a second lateral direction (Y direction). Thus, in a view from above, the plurality of first lower patterns M1-2b may be arranged in a tile shape or a hexagonal shape. At a vertical level at which the plurality of first lower patterns M1-2b are located, a percentage taken by the plurality of first lower patterns M1-2b may be greater than or equal to about 25% and lower than about 45% in a view from above.

The plurality of second lower patterns M2-2b may be apart from each other in the first lateral direction (X direction) and arranged in zigzag apart from each other in the second lateral direction (Y direction). Thus, in a view from above, the plurality of second lower patterns M2-2b may be arranged in a tile shape or a hexagonal shape. At a vertical level at which the plurality of second lower patterns M2-2b are located, a percentage taken by the plurality of second lower patterns M2-2b may be greater than or equal to about 25% and lower than about 45% in a view from above.

The plurality of third lower patterns M3-2b may be apart from each other in the first lateral direction (X direction) and arranged in zigzag apart from each other in the second lateral direction (Y direction). Thus, in a view from above, the plurality of third lower patterns M3-2b may be arranged in a tile shape or a hexagonal shape. At a vertical level at which the plurality of third lower patterns M3-2b are located, a percentage taken by the plurality of third lower patterns M3-2b may be greater than or equal to about 25% and lower than about 45% in a view from above.

The plurality of fourth lower patterns M4-2b may be apart from each other in the first lateral direction (X direction) and arranged in zigzag apart from each other in the second lateral direction (Y direction). Thus, in a view from above, the plurality of fourth lower patterns M4-2b may be arranged in a tile shape or a hexagonal shape. At a vertical level at which the plurality of fourth lower patterns M4-2b are located, a percentage taken by the plurality of fourth lower patterns M4-2b may be greater than or equal to about 25% and lower than about 45% in a view from above.

In the vertical direction (Z direction), at least two of portions of the plurality of first lower patterns M1-2b, portions of the plurality of second lower patterns M2-2b, portions of the plurality of third lower patterns M3-2b, and portions of the plurality of fourth lower patterns M4-4b may overlap each other. For example, in the vertical direction (Z direction), one of the plurality of first lower patterns M1-2b may overlap portions of two of the plurality of second lower patterns M2-2b, portions of two of the plurality of third lower patterns M3-2b, and portions of two of the plurality of fourth lower patterns M4-2b. In the vertical direction (Z direction), one of the plurality of second lower patterns M2-2b may overlap portions of two of the plurality of first lower patterns M1-2b, portions of two of the plurality of third lower patterns M3-2b, and portions of two of the plurality of fourth lower patterns M4-2b. In the vertical direction (Z direction), one of the plurality of third lower patterns M3-2b may overlap portions of two of the plurality of first lower patterns M1-2b, portions of two of the plurality of second lower patterns M2-2b, and portions of two of the plurality of fourth lower patterns M4-2b. In the vertical direction (Z direction), one of the plurality of fourth lower patterns M4-2b may overlap portions of two of the plurality of first lower patterns M1-2b, portions of two of the plurality of second lower patterns M2-2b, and portions of two of the plurality of third lower patterns M3-2b.

In the vertical direction (Z direction), respective spaces between the plurality of first lower patterns M1-2b may be entirely overlapped by the plurality of second lower patterns M2-2b, the plurality of third lower patterns M3-2b, and the plurality of fourth lower patterns M4-2b. In the vertical direction (Z direction), respective spaces between the plurality of second lower patterns M2-2b may be entirely overlapped by the plurality of first lower patterns M1-2b, the plurality of third lower patterns M3-2b, and the plurality of fourth lower patterns M4-2b. In the vertical direction (Z direction), respective spaces between the plurality of third lower patterns M3-2b may be entirely overlapped by the plurality of first lower patterns M1-2b, the plurality of second lower patterns M2-2b, and the plurality of fourth lower patterns M4-2b. In the vertical direction (Z direction), respective spaces between the plurality of fourth lower patterns M4-2b may be entirely overlapped by the plurality of first lower patterns M1-2b, the plurality of second lower patterns M2-2b, and the plurality of third lower patterns M3-2b.

Figure 7:
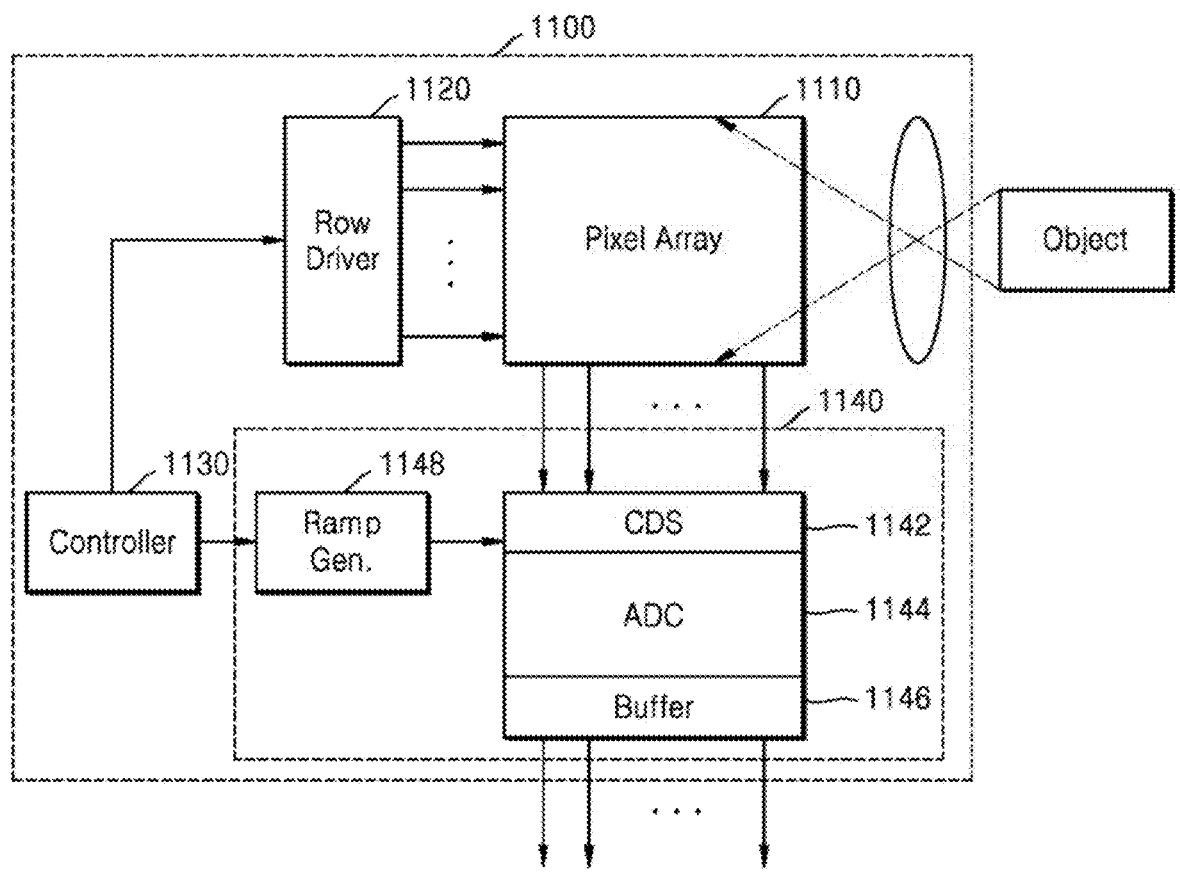
FIG. 7 is a block diagram of a configuration of an image sensor package according to some example embodiments.

FIG. 7 is a block diagram of a configuration of an image sensor package 1100 according to some example embodiments.

Referring to FIG. 7, the image sensor package 1100 may include a pixel array 1110, a controller 1130, a row driver 1120, and a pixel signal processor 1140. The image sensor package 1100 may include at least one of the image sensor package 1, 1a, and 1b described with reference to FIGS. 1A to 6E.

The pixel array 1110 may include a plurality of unit pixels arranged two-dimensionally, and each of the unit pixels may include a photoelectric conversion element. The photoelectric conversion element may absorb light and generate charges, and an electric signal (an output voltage) corresponding to the generated charges may be provided to the pixel signal processor 1140 through a vertical signal line. The unit pixels included in the pixel array 1110 may provide one output voltage at a time in row units. Accordingly, unit pixels in one row of the pixel array 1110 may be simultaneously or substantially simultaneously activated in response to a selection signal output by the row driver 1120. The unit pixel in a selected row may provide the output voltage corresponding to the absorbed light to an output line of a column corresponding thereto.

The controller 1130 may control the row driver 1120 such that the pixel array 1110 accumulates charges by absorbing light, temporarily stores the accumulated charges, or outputs an electric signal corresponding to the stored charges to the outside of the pixel array 1110. In addition, the controller 1130 may control the pixel signal processor 1140 to measure the output voltage provided by the pixel array 1110.

The pixel signal processor 1140 may include a correlated double sampler (CDS) 1142, an analog-to-digital converter (ADC) 1144, and a buffer 1146. The CDS 1142 may sample and hold the output voltage provided by the pixel array 1110.

The CDS 1142 may double-sample a specific noise level and a level corresponding to a generated output voltage and output a level corresponding to a difference therebetween. In addition, the CDS 1142 may receive ramp signals generated by a ramp signal generator (or Ramp Gen.) 1148, compare the ramp signals, and output a comparison result.

The ADC 1144 may convert an analog signal corresponding to a level received from the CDS 1142 into a digital signal. The buffer 1146 may latch the digital signal, and the latched signals may be sequentially output to the outside of the image sensor package 1100 and transmitted to an image processor (not shown).

In some example embodiments, the pixel array 1110 may be in the first substrate portion 100 (e.g., the sensor portion 120) included in the image sensor package 1, 1a, and 1b described with reference to FIGS. 1A to 6E. In some example embodiments, at least some of the row driver 1120, the controller 1130, and the pixel signal processor 1140 may be in the second substrate portion 200 included in the image sensor package 1, 1a, and 1b described with reference to FIGS. 1A to 6E.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been particularly shown and described with reference to some example embodiments thereof, it will be understood that various changes in form and details may be made therein without departing from the spirit and scope of the inventive concepts.

What is claimed is:

1. An image sensor package comprising:
a first substrate portion comprising a first substrate and an upper wiring structure, the first substrate including a first surface and a second surface opposite to the first surface, the first substrate comprising a sensor portion, a plurality of active pixels in the sensor portion, the upper wiring structure on the first surface of the first substrate, and the upper wiring structure comprising a stacked structure including a plurality of upper wiring patterns and a plurality of upper wiring vias;
a second substrate portion comprising a second substrate and a lower wiring structure, the second substrate including a third surface and a fourth surface opposite to the third surface, the second substrate defining a trench portion extending inward from the fourth surface of the second substrate, the second substrate defining a via hole extending from a bottom surface of the trench portion to the third surface of the second substrate, the lower wiring structure on the third surface of the second substrate, and the lower wiring structure comprising a stacked structure including a plurality of lower wiring patterns and a plurality of lower wiring vias, wherein the lower wiring structure is in contact with the upper wiring structure, the plurality of lower wiring patterns comprise a plurality of lower patterns at different vertical levels; and
a via electrode portion covering an inner sidewall and a bottom surface of the via hole, the via electrode portion extending into the lower wiring structure and connected to at least a portion of the plurality of lower wiring patterns, and, in the lower wiring structure, the via electrode portion entirely overlaps at least two of the plurality of lower patterns in a vertical direction, the at least two of the plurality of lower patterns at different vertical levels.

2. The image sensor package of claim 1, wherein
the plurality of lower wiring patterns comprise a plurality of first lower patterns and a plurality of second lower patterns, the plurality of first lower patterns and the plurality of second lower patterns at different levels from each other in a vertical direction from the third surface of the second substrate, and,
in the lower wiring structure, the via electrode portion entirely overlaps the plurality of first lower patterns and the plurality of second lower patterns in the vertical direction.

3. The image sensor package of claim 2, wherein the via electrode portion is in contact with and electrically connected to the plurality of first lower patterns and the plurality of second lower patterns.

4. The image sensor package of claim 2, wherein
each of the plurality of first lower patterns and the plurality of second lower patterns is a line pattern,
respective spaces between the plurality of first lower patterns, which overlap the via hole in the vertical direction, are entirely overlapped by the plurality of second lower patterns, and
respective spaces between the plurality of second lower patterns, which overlap the via hole, are entirely overlapped by the plurality of first lower patterns.

5. The image sensor package of claim 4, wherein
the plurality of first lower patterns each have a first width, the plurality of first lower patterns are a first distance apart from each other, and the first distance is less than the first width, and
the plurality of second lower patterns each have a second width, the plurality of second lower patterns are a second distance apart from each other, and the second distance is less than the second width.

6. The image sensor package of claim 1, wherein
the plurality of lower wiring patterns comprise a plurality of first lower patterns, a plurality of second lower patterns, a plurality of third lower patterns, and a plurality of fourth lower patterns, and the plurality of first lower patterns, the plurality of second lower patterns, the plurality of third lower patterns and the plurality of fourth lower patterns are at different vertical levels in the vertical direction from the third surface of the second substrate, and,
in the lower wiring structure, the via electrode portion entirely overlaps the plurality of first lower patterns, the plurality of second lower patterns, the plurality of third lower patterns, and the plurality of fourth lower patterns in the vertical direction.

7. The image sensor package of claim 6, wherein the via electrode portion is in contact with and electrically connected to the plurality of first lower patterns, the plurality of second lower patterns, the plurality of third lower patterns, and the plurality of fourth lower patterns.

8. The image sensor package of claim 6, wherein
each of the plurality of first lower patterns, the plurality of second lower patterns, the plurality of third lower patterns, and the plurality of fourth lower patterns comprises a tetragonal pattern, and
respective spaces between the plurality of first lower patterns, which overlap the via hole in the vertical direction, are entirely overlapped by the plurality of second lower patterns, the plurality of third lower patterns, and the plurality of fourth lower patterns.

9. The image sensor package of claim 8, wherein
the plurality of first lower patterns occupy greater than or equal to 25% of a lateral cross section area of a vertical level at which the plurality of first lower patterns are located,
the plurality of second lower patterns occupy greater than or equal to 25% of a lateral cross section area of a vertical level at which the plurality of second lower patterns are located,
the plurality of third lower patterns occupy greater than or equal to 25% of a lateral cross section area of a vertical level at which the plurality of third lower patterns are located, and
the plurality of fourth lower patterns occupy greater than or equal to 25% of a lateral cross section area of a vertical level at which the plurality of fourth lower patterns are located.

10. The image sensor package of claim 1, further comprising:
a glass plate on the second surface of the first substrate; and
a dam structure between the glass plate and the first substrate.

11. An image sensor package comprising:
a first substrate portion comprising a first substrate including a first surface and a second surface opposite to the first surface, the first substrate portion including and an upper wiring structure on the first surface of the first substrate;
a second substrate portion including a second substrate and a lower wiring structure, the second substrate including a third surface and a fourth surface opposite to the third surface, the lower wiring structure on the third surface of the second substrate, and the lower wiring structure comprising a stacked structure including a plurality of lower wiring patterns and a plurality of lower wiring vias, wherein the lower wiring structure is in contact with the upper wiring structure; and a via electrode portion passing through the second substrate and connected to at least a portion of the plurality of lower wiring patterns, wherein, in the lower wiring structure, the via electrode portion entirely overlaps at least two of the plurality of lower wiring patterns vertically, the at least two of the plurality of lower wiring patterns are at at least two different vertical levels, and the via electrode portion is in contact with and electrically connected to the at least two of the plurality of lower wiring patterns located at the at least two different vertical levels.

12. The image sensor package of claim 11, wherein the second substrate defines a trench portion extending inward from the fourth surface, the second substrate defines a via hole in communication with the trench portion, the via hole extends to the third surface, and the image sensor package further comprises, a first passivation layer covering an inner sidewall of the trench portion, an inner sidewall of the via hole, and the fourth surface of the second substrate;

a lower electrode layer comprising the via electrode portion and a back wiring portion electrically connected to the via electrode portion, the back wiring portion on a portion of the first passivation layer, the portion of the first passivation layer covering the fourth surface of the second substrate;

a second passivation layer covering a portion of the lower electrode layer; and a plurality of external connection terminals on the fourth surface of the second substrate, the plurality of external connection terminals electrically connected to the back wiring portion.

13. The image sensor package of claim 11, wherein the plurality of lower wiring patterns comprise a plurality of first lower patterns and a plurality of second lower patterns, the plurality of first lower patterns and the plurality of second lower patterns are at different vertical levels, and each of the plurality of lower wiring patterns comprises a line pattern, and one of the plurality of first lower patterns overlaps portions of two of the plurality of second lower patterns in a vertical direction, and one of the plurality of second lower patterns overlaps portions of two of the plurality of first lower patterns.

14. The image sensor package of claim 13, wherein the plurality of first lower patterns occupy greater than or equal to 50% of a lateral cross section of a vertical level at which the plurality of first lower patterns are located, the plurality of second lower patterns occupy greater than or equal to 50% of a lateral cross section area of a vertical level at which the plurality of second lower patterns are located, and, in the lower wiring structure, the via electrode portion entirely overlaps the plurality of first lower patterns and the plurality of second lower patterns in the vertical direction.

15. The image sensor package of claim 11, wherein the plurality of lower wiring patterns comprise a plurality of first lower patterns, a plurality of second lower patterns, a plurality of third lower patterns, and a plurality of fourth lower patterns, each of the plurality of first lower patterns, the plurality of second lower patterns, the plurality of third lower patterns, and the plurality of fourth lower patterns comprises a tetragonal pattern, each of the plurality of first lower patterns, the plurality of second lower patterns, the plurality of third lower patterns, and the plurality of fourth lower patterns are at different vertical levels in a vertical direction from the third surface of the second substrate, and in the lower wiring structure, the via electrode portion entirely overlaps the plurality of first lower patterns, the plurality of second lower patterns, the plurality of third lower patterns, and the plurality of fourth lower patterns, in the vertical direction.

16. The image sensor package of claim 15, wherein the plurality of first lower patterns, the plurality of second lower patterns, the plurality of third lower patterns, and the plurality of fourth lower patterns are apart from each other in each of a first lateral direction and a second lateral direction, the plurality of first lower patterns, the plurality of second lower patterns, the plurality of third lower patterns, and the plurality of fourth lower patterns are in a matrix arrangement in a plane including the first lateral direction and the second lateral direction, and the first lateral direction is perpendicular to the second lateral direction.

17. The image sensor package of claim 15, wherein the plurality of first lower patterns, the plurality of second lower patterns, the plurality of third lower patterns, and the plurality of fourth lower patterns are apart from each other in a first lateral direction, the plurality of first lower patterns, the plurality of second lower patterns, the plurality of third lower patterns, and the plurality of fourth lower patterns are in a zigzag pattern apart from each other in a second lateral direction, the plurality of first lower patterns, the plurality of second lower patterns, the plurality of third lower patterns, and the plurality of fourth lower patterns define a hexagonal shape in a plane including the first lateral direction and the second lateral direction, and the second lateral direction is perpendicular to the first lateral direction.

18. An image sensor package comprising:

a first substrate including a first surface and a second surface opposite to the first surface, the first substrate comprising a sensor portion, a plurality of active pixels in the sensor portion;

a glass plate on the second surface of the first substrate;

a dam structure between the glass plate and the first substrate, the dam structure including an outer side surface aligned with a side surface of the glass plate in a vertical direction;

an upper wiring structure on the first surface of the first substrate, the upper wiring structure comprising a stacked structure including a plurality of upper wiring patterns and a plurality of upper wiring vias;

a second substrate including a third surface and a fourth surface opposite to the third surface, the second substrate defining a trench portion extending inward from the fourth surface thereof, the second substrate defining a via hole extending from a bottom surface of the trench portion to the third surface of the second substrate;

a lower wiring structure on the third surface of the second substrate, the lower wiring structure in contact with the upper wiring structure, the lower wiring structure comprising a stacked structure including a plurality of lower wiring patterns and a plurality of lower wiring vias, the plurality of lower wiring patterns comprising a plurality of lower patterns located at different vertical levels;

a first passivation layer covering an inner sidewall of the trench portion, an inner sidewall of the via hole, and the fourth surface of the second substrate;

a lower electrode layer comprising a via electrode portion and a back wiring portion, wherein the via electrode portion is on the first passivation layer, the via electrode portion covers an inner sidewall and a bottom surface of the via hole, the via electrode portion is connected to at least a portion of the plurality of lower wiring patterns by extending into the lower wiring structure, the back wiring portion is electrically connected to the via electrode portion, the back wiring portion is on a portion of the first passivation layer, and the portion of the first passivation layer covers the fourth surface of the second substrate;

a second passivation layer covering a portion of the lower electrode layer; and a plurality of external connection terminals on the fourth surface of the second substrate, the plurality of external connection terminals electrically connected to the back wiring portion, wherein, in the lower wiring structure, the via electrode portion entirely overlaps at least two of the plurality of lower patterns in the vertical direction, the at least two of the plurality of lower patterns are at at least two different vertical levels, and the via electrode portion is in contact with and electrically connected to the at least two of the plurality of lower patterns located at the at least two different vertical levels.

19. The image sensor package of claim 18, wherein, at least a portion of the plurality of lower patterns are at a same vertical level and occupy greater than or equal to 55% and lower than about 85% of a lateral cross sectional area of the same vertical level.

20. The image sensor package of claim 18, wherein the plurality of lower wiring patterns comprise a plurality of first lower patterns and a plurality of second lower patterns, the plurality of first lower patterns and the plurality of second lower patterns are at different vertical levels, and the plurality of lowering wiring patterns each comprise a line pattern, the plurality of first lower patterns each have a first width, the plurality of first lower patterns are a first distance apart from each other, the plurality of second lower patterns each have a second width, the plurality of second lower patterns are a second distance apart from each other, the first distance is less than the first width, and the second distance is less than the second width, and each of the first width and the second width is in a range of 2 μm to 6 μm.

* * * * *